(12) United States Patent
Sugimoto et al.

(10) Patent No.: US 9,059,084 B2
(45) Date of Patent: Jun. 16, 2015

(54) STACKED SEMICONDUCTOR DEVICE AND PRINTED CIRCUIT BOARD

(71) Applicant: CANON KABUSHIKI KAISHA, Tokyo (JP)

(72) Inventors: Satoshi Sugimoto, Yokohama (JP); Yoshitaka Kawase, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 101 days.

(21) Appl. No.: 14/017,410

(22) Filed: Sep. 4, 2013

(65) Prior Publication Data
US 2014/0070384 A1    Mar. 13, 2014

(30) Foreign Application Priority Data
Sep. 10, 2012  (JP) .................................. 2012-198021

(51) Int. Cl.
*H01L 23/00*    (2006.01)
(52) U.S. Cl.
CPC ....... *H01L 24/25* (2013.01); *H01L 2924/15311* (2013.01)

(58) Field of Classification Search
USPC .......................................... 257/686, 777, 666
See application file for complete search history.

(56) References Cited

FOREIGN PATENT DOCUMENTS

JP    2009-182087 A    8/2009

*Primary Examiner* — Roy Potter
(74) *Attorney, Agent, or Firm* — Fitzpatrick, Cella, Harper & Scinto

(57) ABSTRACT

An interposer of a first semiconductor package includes a power supply wiring for a second semiconductor element, the power supply wiring including a land provided in one surface layer, and a power supply pattern provided in an inner layer and electrically connected to the land, the power supply wiring further including a larger number of lands than the land, which are provided in another surface layer and electrically connected in parallel to the power supply pattern. In a stacked semiconductor device, this configuration can improve the quality of power supply to the second semiconductor element to secure signal processing operation while preventing an increase in inductance caused by the bending of a power supply path in a power supply wiring of a printed wiring board or by a deviation of connection intervals.

19 Claims, 16 Drawing Sheets

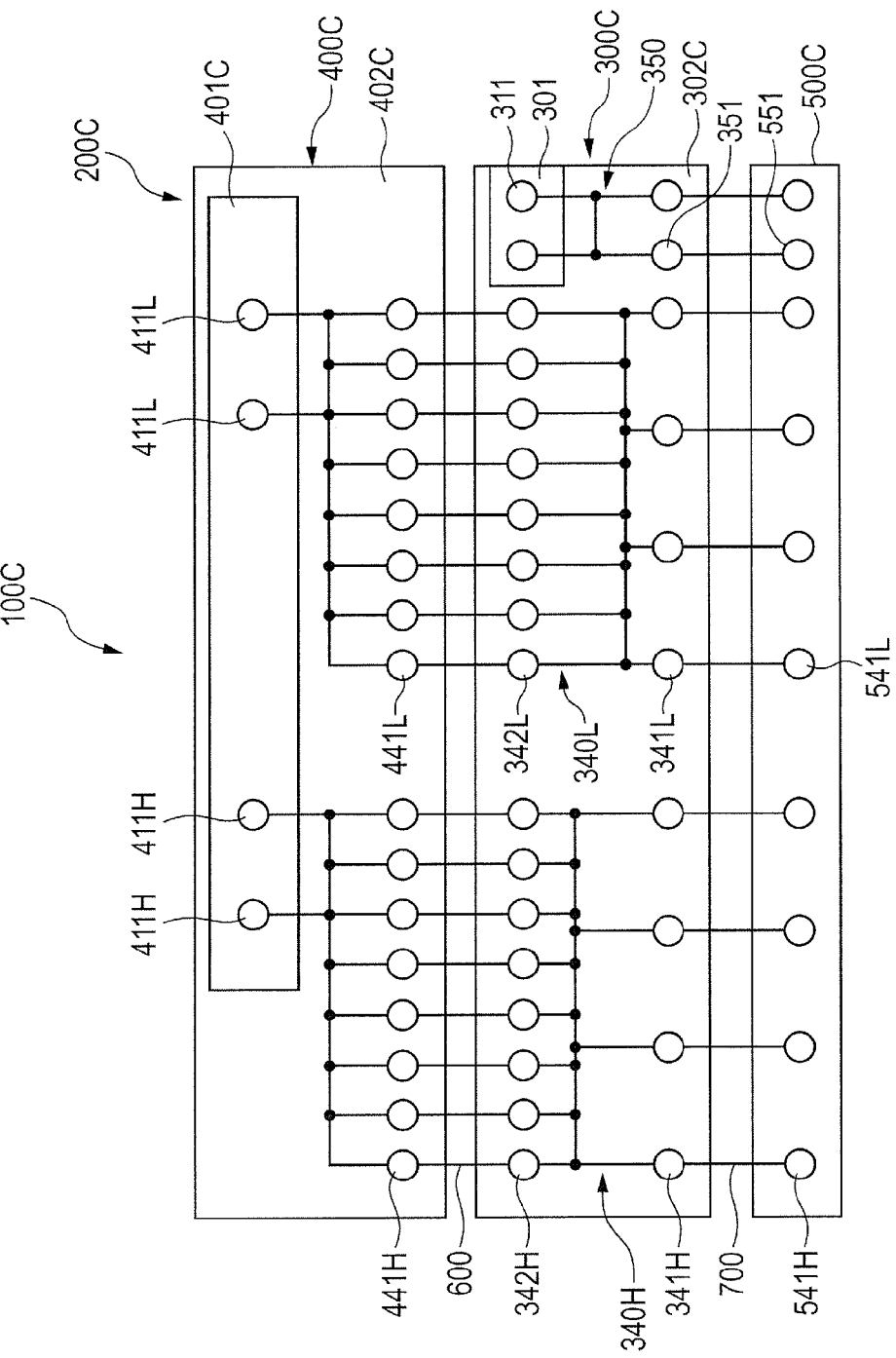

STACKED SEMICONDUCTOR DEVICE AND PRINTED CIRCUIT BOARD

BACKGROUND OF THE INVENTION

1. Field of the Invention

The present invention relates to a stacked semiconductor device in which semiconductor packages are stacked, and a printed circuit board including the stacked semiconductor device.

2. Description of the Related Art

In recent years, along with the sophistication and miniaturization of electronic devices, demands have been growing for sophisticated and miniaturized electronic components and semiconductor devices used in the electronic devices. A semiconductor package called "ball grid array (BGA)" is known as the structure for realizing a high-pin count and compact semiconductor device. For further miniaturization, a stacked semiconductor device called "package-on-package (PoP)" is known, in which a semiconductor package including a memory semiconductor element is stacked on a semiconductor package including a logic semiconductor element, for example.

The stacked semiconductor device is advantageous in that, even when the number of electrode terminals is increased, the ratio of a mounting area can be reduced by stacking the semiconductor packages, that is, the miniaturization is possible. The stacking of the semiconductor packages is suitable for high-speed transmission because a signal wiring distance is reduced as compared with the planar arrangement. The stacked semiconductor device therefore tends to be employed in electronic devices more often in the future. On the other hand, the operating frequency of the semiconductor element is becoming higher in order to support high-speed operation of the electronic devices.

Achieving signal operation of the semiconductor element at a high frequency such as several hundreds of MHz or more requires improving high frequency characteristics of a power source for supplying power to the semiconductor element to stabilize the potential at the operating frequency. To achieve this, a power supply wiring of a printed wiring board needs to have low inductance in a corresponding operating frequency region.

As a conventional method for decreasing the inductance of the power supply wiring of the printed wiring board, Japanese Patent Application Laid-Open No. 2009-182087 describes that a power supply wiring and a ground wiring are arranged in adjacent to each other or that multiple wirings are provided. In Japanese Patent Application Laid-Open No. 2009-182087, wiring layers are connected by connection conductors, and a power supply connection conductor and a ground connection conductor are arranged in adjacent to each other, to thereby increase the mutual inductance. Further, multiple power supply connection conductors and multiple ground connection conductors are arranged, to thereby decrease the self-inductance. As a result, the combined inductance of the power supply wiring and the ground wiring obtained by subtracting the mutual inductance from the self-inductance is decreased.

However, the technology described in Japanese Patent Application Laid-Open No. 2009-182087 is not always sufficient for further decreasing the inductance.

In a general stacked semiconductor device, a power supply wiring for supplying power to both a first semiconductor element located in a lower stage and a second semiconductor element located in an upper stage is formed in a lower first printed wiring board, and the power is supplied from a mother board. Because the first semiconductor element is to be mounted on the first printed wiring board, a connection portion of the first printed wiring board to an upper second printed wiring board needs to be provided at a position that avoids the first semiconductor element. In this case, in the first printed wiring board, an interval between connection lands for the second printed wiring board and an interval between connection lands for the mother board are not always equal to each other. Similarly, the position of the connection land for the second printed wiring board and the position of the connection land for the mother board when projected from above are not always identical to each other. Thus, a path of the power supply wiring that connects a first surface layer and a second surface layer of the first printed wiring board is bent. The bent power supply wiring may be responsible for an increase in self-inductance of the power supply wiring.

It is often the case that the printed wiring board for use in the stacked semiconductor device is made up of a core layer and a build-up layer. In the case of a printed wiring board in which a via of the build-up layer is connected immediately above a via of the core layer, the yields are low and the cost is high. It is therefore necessary to offset the position of the via that connects the build-up layers and the position of the via that connects the core layers. Thus, a path of the power supply wiring is bent, which may similarly be responsible for an increase in self-inductance.

On the other hand, a conceivable method for decreasing the self-inductance of the power supply wiring for supplying power to the second semiconductor element is to increase the number of power supply lands of the first printed wiring board on the mother board side so as to increase the number of power supply paths. In this configuration, however, it is difficult to take out a signal wiring of a surface layer of the mother board on which the stacked semiconductor device is mounted.

SUMMARY OF THE INVENTION

It is therefore an object of the present invention to improve the quality of power supply to a second semiconductor element to stabilize signal processing operation of the second semiconductor element while securing the wiring capability of a motherboard.

A stacked semiconductor device according to one embodiment of the present invention includes: a first semiconductor package; and a second semiconductor package stacked on the first semiconductor package through a solder joint portion, the first semiconductor package including: a first semiconductor element; and a first printed wiring board on which the first semiconductor element is mounted, the first printed wiring board including: a first power supply input land provided in a first surface layer of the first printed wiring board, for establishing connection to an outside of the stacked semiconductor device; a first power supply output land provided in a second surface layer of the first printed wiring board on the second semiconductor package side, for establishing connection to the second semiconductor package, the second surface layer being located on a rear side of the first surface layer; and a first power supply pattern provided in a first inner layer between the first surface layer and the second surface layer and electrically connected to the first power supply input land and the first power supply output land, the second semiconductor package including: a second semiconductor element; and a second printed wiring board on which the second semiconductor element is mounted, the second printed wiring board including a second power supply input land provided in a third surface layer of the second printed wiring board on the first semiconductor package side, for establishing connection to the first power supply output lands through the solder joint portion, the second power supply input land being connected to a first power supply terminal of the second semiconductor element, in which a number of the first power supply input lands connected to the first power supply pattern is larger than a number of the first power supply output lands connected to the first power supply pattern.

With this configuration, the quality of power supply to the second semiconductor element can be improved to stabilize the signal processing operation of the second semiconductor element while the wiring capability of the mother board is secured.

Further features of the present invention will become apparent from the following description of exemplary embodiments with reference to the attached drawings.

BRIEF DESCRIPTION OF THE DRAWINGS

FIG. 13 is a schematic diagram of a printed circuit board according to a fourth embodiment of the present invention.

DESCRIPTION OF THE EMBODIMENTS

Now, embodiments of the present invention are described in detail with reference to the accompanying drawings.

First Embodiment

Figure 1:
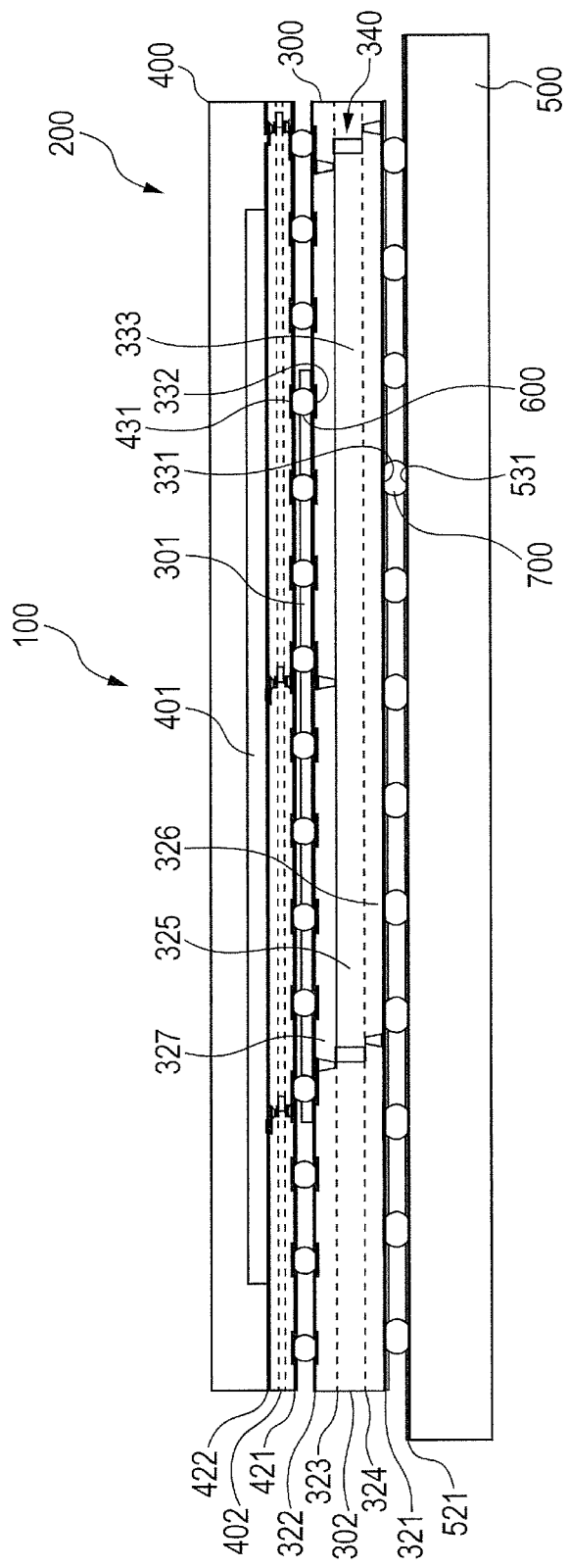
FIG. 1 is a cross-sectional view illustrating a schematic configuration of a printed circuit board according to a first embodiment of the present invention.
Figure 2:
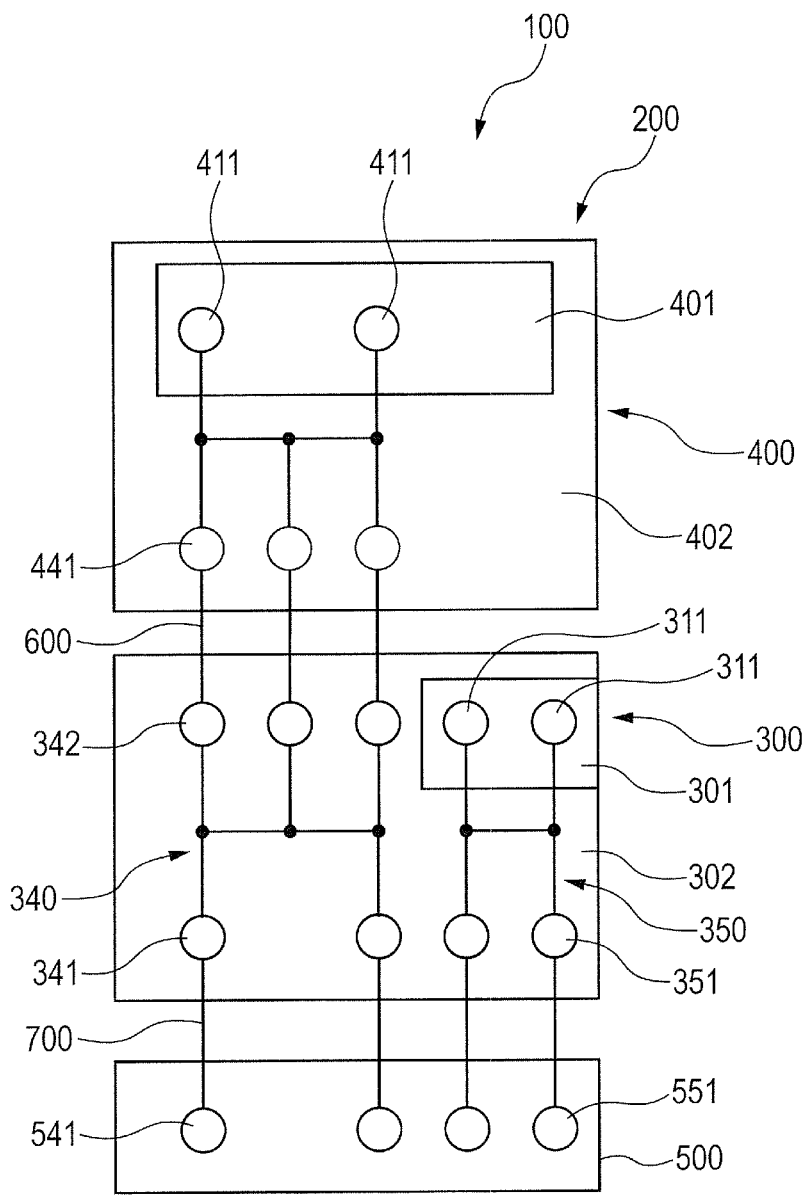
FIG. 2 is a schematic diagram of the printed circuit board according to the first embodiment.

FIG. 1 is a cross-sectional view illustrating a schematic configuration of a printed circuit board including a stacked semiconductor device according to a first embodiment of the present invention. FIG. 2 is a schematic diagram of the printed circuit board including the stacked semiconductor device according to the first embodiment of the present invention.

A printed circuit board 100 includes a stacked semiconductor device 200, and a mother board 500 on which the stacked semiconductor device 200 is mounted. The stacked semiconductor device 200 is a stacked semiconductor package having a package-on-package (PoP) structure. The stacked semiconductor device 200 includes a lower semiconductor package 300 as a first semiconductor package and an upper semiconductor package 400 as a second semiconductor package, and the semiconductor package 400 is stacked on the semiconductor package 300.

The semiconductor package 300 includes a lower semiconductor element 301 as a first semiconductor element and a lower interposer 302 as a first printed wiring board (first interposer). The semiconductor package 400 includes an upper semiconductor element 401 as a second semiconductor element and an upper interposer 402 as a second printed wiring board (second interposer). The interposers 302 and 402 are each a rectangular multilayer substrate in plan view. In the first embodiment, the interposer 302 is a multilayer substrate made up of four conductor layers by a core layer 325 and build-up layers 326 and 327 formed on upper and lower surfaces of the core layer 325. The semiconductor element 301 is, for example, a system LSI. The semiconductor element 401 is, for example, a memory. In the first embodiment, the semiconductor elements 301 and 401 are configured to operate by being supplied with the same power supply voltage (first power supply voltage), and have power supply terminals 311 and 411, respectively.

In the interposer 302, there are formed a surface layer 321 as a first surface layer, a surface layer 322 as a second surface layer on the opposite side of the first surface layer, and inner layers 323 and 324 as a first inner layer and a second inner layer arranged between the surface layers 321 and 322. The layers 321 to 324 are conductor layers in which conductors are arranged. Specifically, the first layer is the surface layer 322, the second layer is the inner layer 323, the third layer is the inner layer 324, and the fourth layer is the surface layer 321. An insulating layer made of an insulator 333 such as a glass epoxy material is formed between the layers. Note that, in the interposer 402, as conductor layers in which conductors are arranged, there are formed a surface layer 421 as a third surface layer, a surface layer 422 as a fourth surface layer, and inner layers arranged between the surface layers 421 and 422.

In the first embodiment, the inner layers 323 and 324 of the interposer 302 are formed on the surfaces of the core layer 325, and the surface layers 321 and 322 are formed on the surfaces of the build-up layers 326 and 327.

The surface layer 321 of the interposer 302 is opposed to a surface layer 521 being a mounting surface of the mother board 500. The surface layer 322 of the interposer 302 is opposed to the surface layer 421 of the interposer 402.

The semiconductor element 301 is mounted on the surface layer 322 of the interposer 302. The semiconductor element 401 is mounted on the surface layer 422 of the interposer 402.

The interposer 302 includes multiple connection conductor lands 331 arranged in the surface layer 321. The conductor lands 331 are arranged in an array at a first pitch. The mother board 500 includes multiple conductor lands 531 in number corresponding to the conductor lands 331, which are arranged in the surface layer 521 so as to be opposed to the conductor lands 331. The conductor lands 531 are arranged in an array at the first pitch similarly to the conductor lands 331.

The interposer 302 includes multiple connection conductor lands 332 arranged in the surface layer 322 at positions that avoid the semiconductor element 301. The conductor lands 332 are arranged in an array at a second pitch different from the first pitch. The interposer 402 includes multiple connection conductor lands 431 in number corresponding to the conductor lands 332, which are arranged in the surface layer 421 so as to be opposed to the conductor lands 332. The conductor lands 431 are arranged in an array at the second pitch similarly to the conductor lands 332.

By joining the opposed conductor lands 332 and 431 together by solder balls 600 being joint conductors, the semiconductor package 400 is stacked on the semiconductor package 300. Then, by joining the opposed conductor lands 331 and 531 together by solder balls 700 being joint conductors, the stacked semiconductor device 200 is mounted on the mother board 500.

The interposer 302 includes a power supply wiring 340 for the semiconductor element 401 as a first power supply wiring, and a power supply wiring 350 for the semiconductor element 301. The power supply wiring 340 is arranged to extend from the surface layer 321 to the surface layer 322. Then, the power supply wiring 340 outputs a power supply voltage being the first power supply voltage input from the surface layer 321 side being the first surface layer side, that is, from the mother board 500, from the surface layer 322 side being the second surface layer side. In this manner, the power supply wiring 340 can supply the power supply voltage supplied from the mother board 500 to the power supply terminals 411 of the semiconductor element 401 through the interposer 402.

The power supply wiring 350 is arranged to extend from the surface layer 321 to the surface layer 322. Then, the power supply wiring 350 can output the power supply voltage being the first power supply voltage input from the surface layer 321 side, that is, from the mother board 500, from the surface layer 322 side, and supply the power supply voltage to the power supply terminals 311 of the semiconductor element 301.

In the first embodiment, the power supply wiring 350 is provided independently of the power supply wiring 340. Consequently, power supply noise generated in the power supply wiring 340 can be prevented from propagating to the power supply wiring 350, and power supply noise generated in the power supply wiring 350 can be prevented from propagating to the power supply wiring 340.

Figure 3:
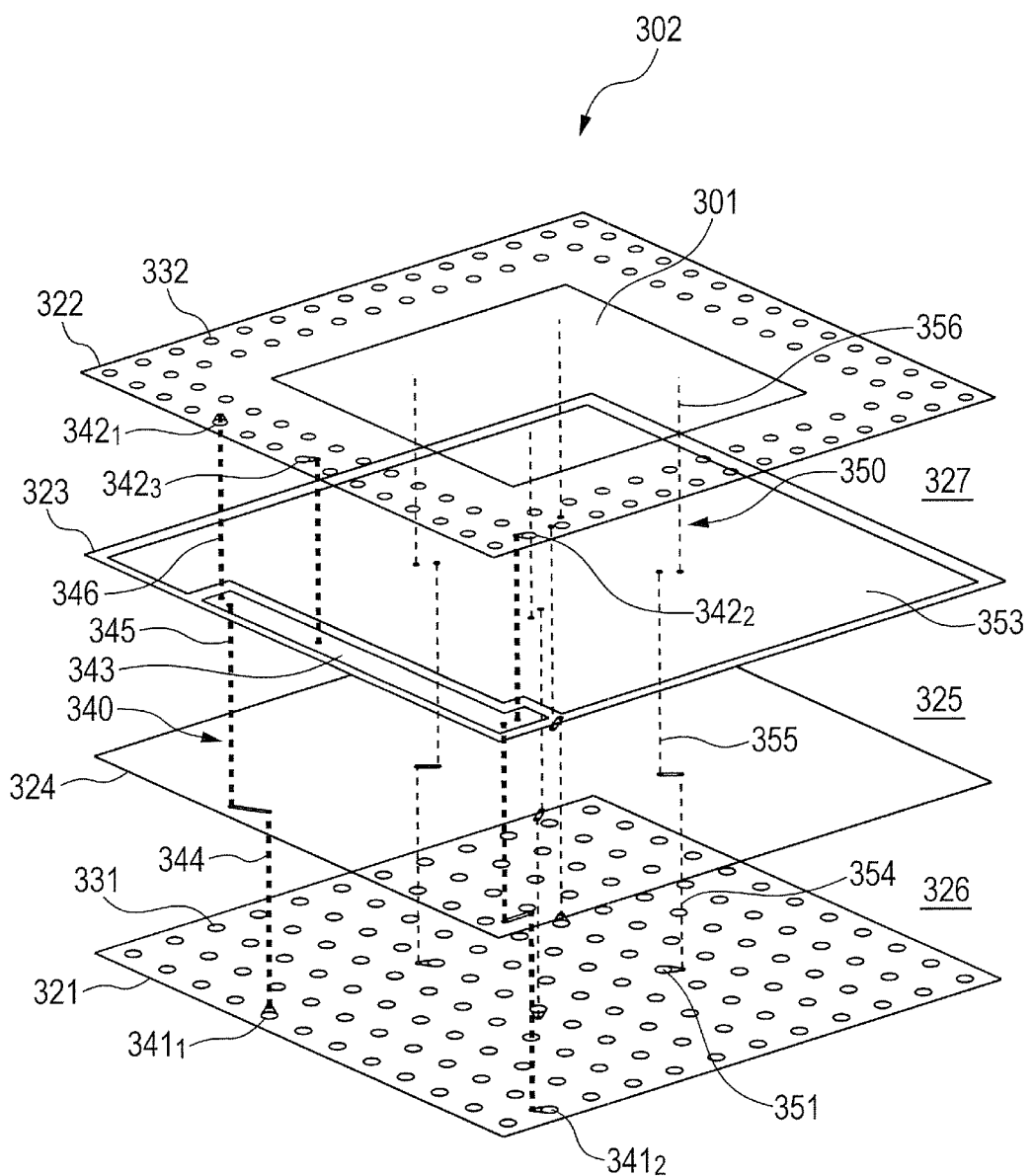
FIG. 3 is a perspective view illustrating respective layers of a first interposer according to the first embodiment.
Figure 4A:
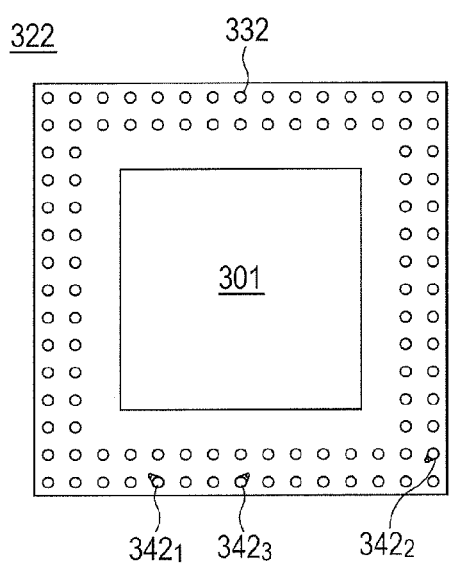
FIGS. 4A, 4B, 4C, and 4D are plan views illustrating the respective layers of the first interposer according to the first embodiment.
Figure 4B:
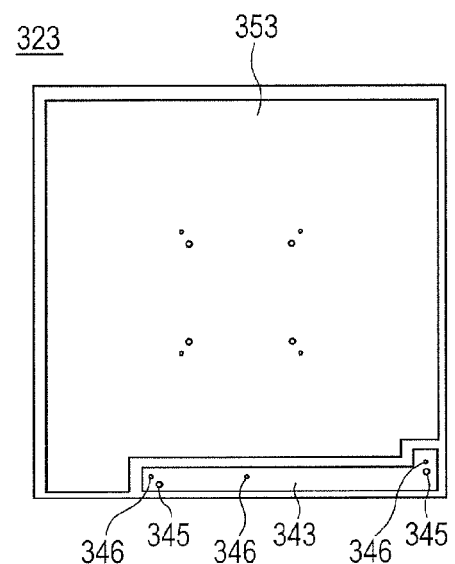
Figure 4C:
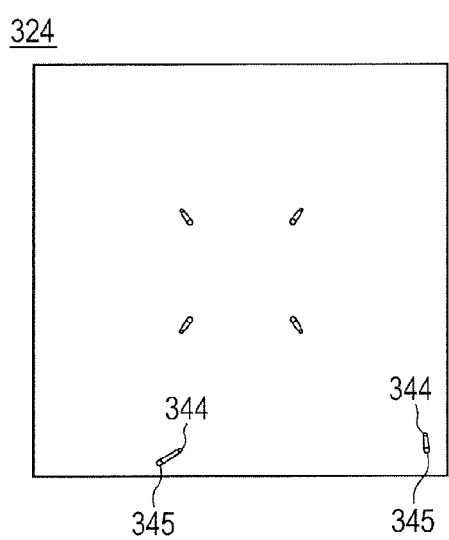
Figure 4D:
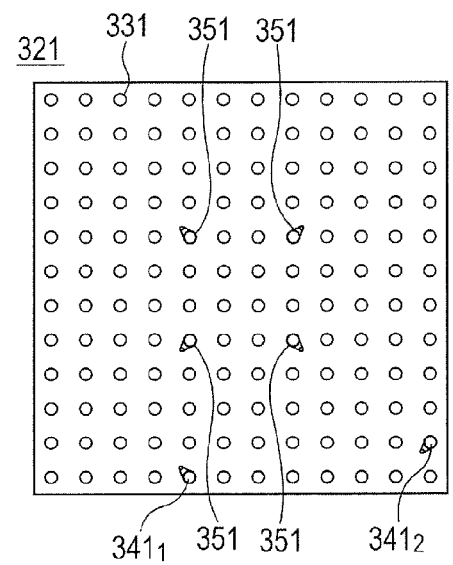

FIG. 3 is a perspective view illustrating the respective layers of the interposer 302. FIGS. 4A to 4D are plan views illustrating the respective layers of the interposer 302. FIG. 4A illustrates the surface layer 322 being the first layer, FIG. 4B illustrates the inner layer 323 being the second layer, FIG. 4C illustrates the inner layer 324 being the third layer, and FIG. 4D illustrates the surface layer 321 being the fourth layer.

The power supply wiring 340 includes multiple lands 341 ($341_1$, $341_2$) as first power supply input lands, which are a part of the conductor lands 331 provided in the surface layer 321 and are used for inputting power from outside the stacked semiconductor device 200. The power supply wiring 340 further includes multiple lands 342 ($342_1$, $342_2$, $342_3$) as first power supply output lands, which are a part of the conductor lands 332 provided in the surface layer 322. The power supply wiring 340 further includes a power supply pattern 343 as a first power supply pattern, which is provided in the inner layer 323 being the first inner layer.

In the first embodiment, the number of the lands 342 is larger than the number of the lands 341. In FIG. 3 and FIGS. 4A to 4D, the number of the lands 341 is two while the number of the lands 342 is three, which is larger than the number of the lands 341.

The lands $341_1$ and $341_2$ are electrically connected in parallel to the power supply pattern 343 through a power supply via 344 of the build-up layer 326, a power supply via 345 of the core layer 325, and the like. The lands $342_1$, $342_2$, and $342_3$ are electrically connected in parallel to the power supply pattern 343 through a power supply via 346 of the build-up layer 327 and the like. In other words, the lands $341_1$ and $341_2$ and the lands $342_1$, $342_2$, and $342_3$ are electrically connected to each other through the power supply pattern 343 and the like.

In the following, as the occasion demands, the lands $341_1$ and $341_2$ are referred to as "first power supply lands", the lands $342_1$ and $342_2$ are referred to as "second power supply lands", and the land $342_3$ is referred to as "third power supply land". In the first embodiment, the second power supply land $342_1$ is provided correspondingly to the first power supply land $341_1$, and the second power supply land $342_2$ is provided correspondingly to the first power supply land $341_2$. Then, the power supply pattern 343 is provided in the inner layer 323, and the third power supply land $342_3$ is provided in the surface layer 322. The first and second power supply lands $341_1$, $341_2$, $342_1$, and $342_2$ are electrically connected to both end portions of the power supply pattern 343. Then, the third power supply land $342_3$ is electrically connected to a region between the both end portions of the power supply pattern 343 (for example, at a center portion).

The lands $341_1$ and $341_2$ are joined to conductor lands 541 (FIG. 2), which are a part of the conductor lands 531 of the mother board 500, by the solder balls 700 being joint conductors. The lands $342_1$, $342_2$, and $342_3$ are joined to conductor lands 441 (FIG. 2), which are a part of the conductor lands 431 of the interposer 402, by the solder balls 600 being joint conductors. In this manner, a DC voltage supplied from the conductor lands 541 of the mother board 500 is supplied to the power supply terminals 411 of the semiconductor element 401 through the power supply wiring 340.

In the first embodiment, the lands 342 are arranged at the peripheral edges of the surface layer 322 while avoiding the semiconductor element 301. Then, the power supply pattern 343 is arranged at a position that does not overlap a projection region obtained by projecting the semiconductor element 301 onto the inner layer 323. The lands 341 are arranged at positions that do not overlap a projection region obtained by projecting the semiconductor element 301 onto the surface layer 321.

On the other hand, the power supply wiring 350 includes lands 351 as power supply input lands, which are a part of the conductor lands 331 provided in the surface layer 321 and are used for inputting power from outside the stacked semiconductor device 200. The power supply wiring 350 further includes a power supply pattern 353 provided in the inner layer 323 being the first inner layer.

The lands 351 are electrically connected to the power supply pattern 353 through a power supply via 354 of the build-up layer 326, a power supply via 355 of the core layer 325, and the like. The power supply pattern 353 is electrically connected to the power supply terminals 311 (FIG. 2) of the semiconductor element 301 through a power supply via 356 of the build-up layer 327 and the like.

In the first embodiment, the power supply pattern 353 is formed to be larger than the projection region obtained by projecting the semiconductor element 301 onto the inner layer 323, and is arranged at a position including the projection region. The lands 351 are arranged at positions opposed to the semiconductor element 301, that is, in the projection region obtained by projecting the semiconductor element 301 onto the surface layer 321.

In the power supply wiring 340, a power supply path is bended because of the power supply vias 344, 345, and 346 that connect the lands $341_1$ and $341_2$ of the surface layer 321 and the lands $342_1$ and $342_2$ of the surface layer 322.

According to the first embodiment, in the power supply wiring 340, the number of the lands 342 is larger than the number of the lands 341, and the number of branches of the power supply path from the power supply pattern 343 is increased, and hence the self-inductance of the power supply wiring 340 is reduced. Consequently, the quality of power supply to the semiconductor element 401 can be improved to stabilize signal processing operation of the semiconductor element 401. Because the number of the lands 341 is smaller than the number of the lands 342, the wiring capability of signal wirings in the surface layer 521 of the mother board 500 can be secured.

The power supply pattern 343 and the power supply pattern 353 are arranged in the same inner layer 323, and hence the number of layers can be reduced as compared with the case where the patterns 343 and 353 are arranged in different layers. Consequently, the cost can be cut down.

As compared with the case where the power supply pattern 343 and the power supply pattern 353 are arranged in different layers, the magnetic coupling between the patterns 343 and 353 can be reduced. Consequently, the problem of interference of the power supply patterns 343 and 353, that is, the propagation of power supply noise from one power supply pattern to the other power supply pattern can be reduced.

In the first embodiment, the both end portions of the power supply pattern 343 are electrically connected to the lands $341_1$ and $341_2$ through the power supply vias 344 and 345, and are electrically connected to the lands $342_1$ and $342_2$ through the power supply via 346. This configuration prevents a stub in the power supply pattern 343 and further reduces the self-inductance of the power supply wiring 340. Consequently, the quality of power supply to the semiconductor element 401 is further improved to further stabilize the signal processing operation of the semiconductor element 401.

In the first embodiment, the land $341_2$ is arranged at the corner of the surface layer 321. This configuration further facilitates the arrangement of the signal wirings in the surface layer 521 of the mother board 500, thus further improving the wiring capability.

Second Embodiment

Figure 5:
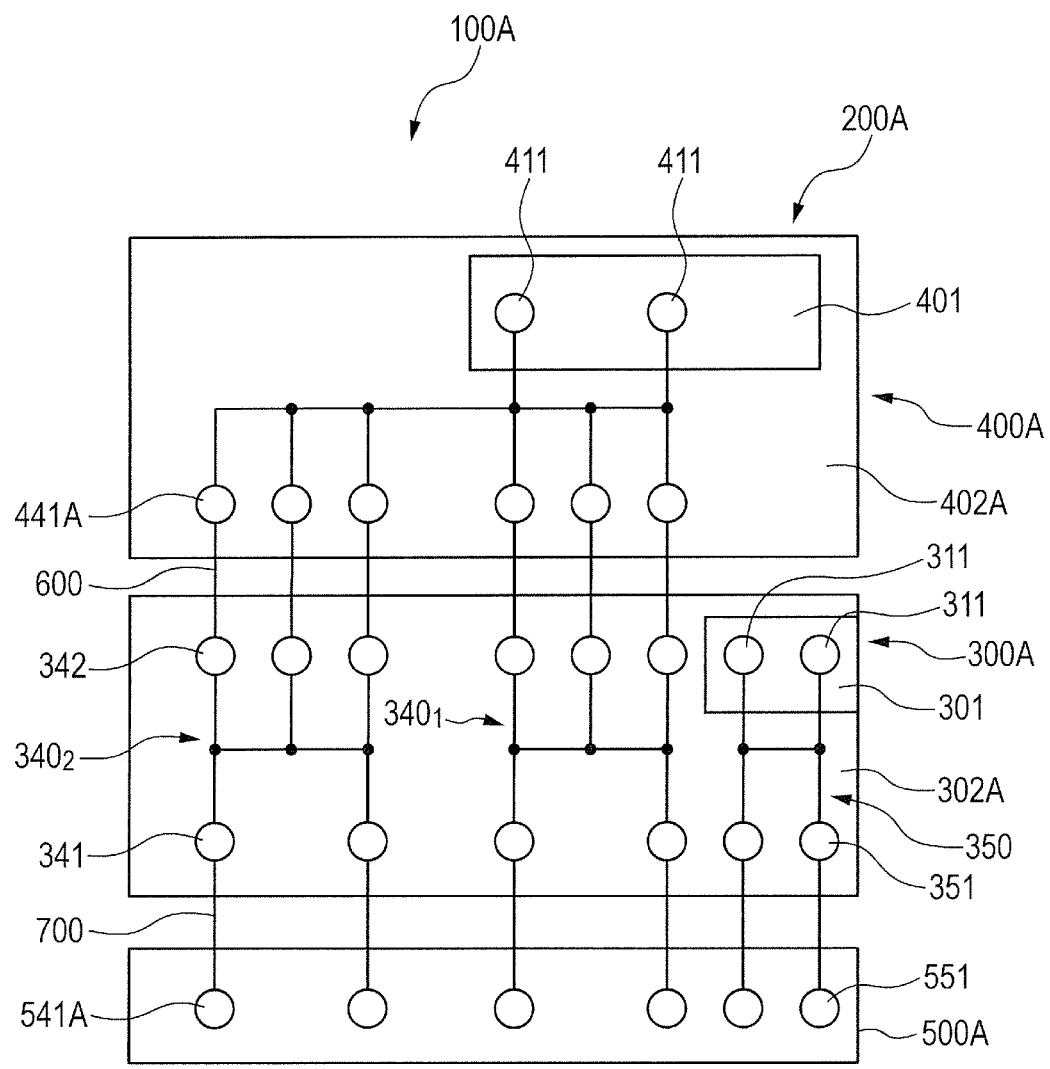
FIG. 5 is a schematic diagram of a printed circuit board according to a second embodiment of the present invention.
Figure 6A:
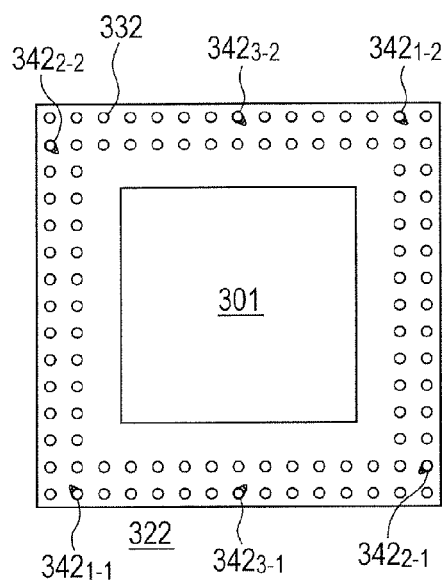
FIGS. 6A, 6B, 6C, and 6D are plan views illustrating respective layers of a first interposer according to the second embodiment.
Figure 6B:
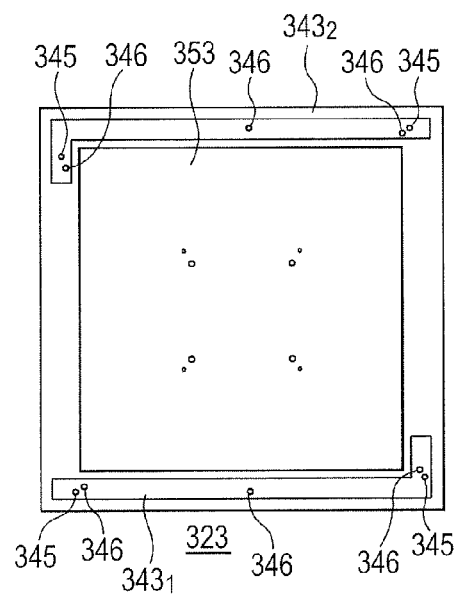
Figure 6C:
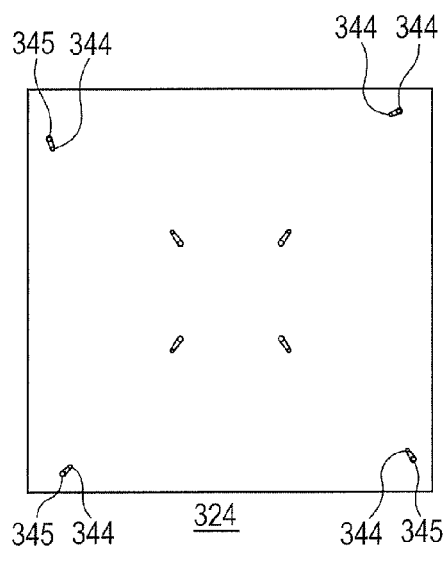
Figure 6D:
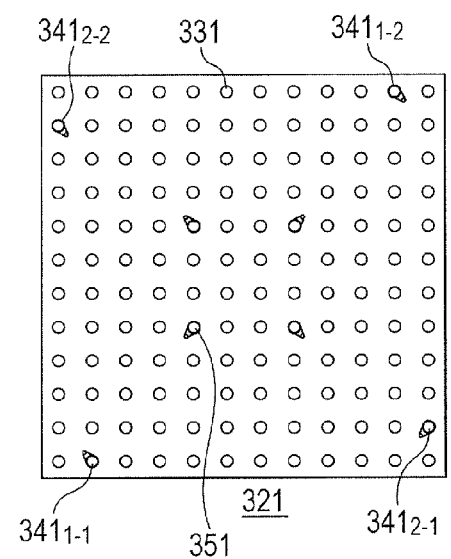

Next, a description is given of a printed circuit board including a stacked semiconductor device according to a second embodiment of the present invention. FIG. 5 is a schematic diagram of the printed circuit board including the stacked semiconductor device according to the second embodiment of the present invention. FIGS. 6A to 6D are plan views illustrating respective layers of a first interposer. FIG. 6A illustrates a first layer, FIG. 6B illustrates a second layer, FIG. 6C illustrates a third layer, and FIG. 6D illustrates a fourth layer. Note that, in the second embodiment, similar components to those in the first embodiment are denoted by the same reference symbols to omit descriptions.

A printed circuit board 100A according to the second embodiment includes a stacked semiconductor device 200A, and a mother board 500A on which the stacked semiconductor device 200A is mounted. The stacked semiconductor device 200A is a stacked semiconductor package having a package-on-package (PoP) structure. The stacked semiconductor device 200A includes a lower semiconductor package 300A as a first semiconductor package and an upper semiconductor package 400A as a second semiconductor package, and the semiconductor package 400A is stacked on the semiconductor package 300A.

The semiconductor package 300A includes the same semiconductor element 301 as in the first embodiment, and a lower interposer 302A as a first printed wiring board (first interposer). The semiconductor package 400A includes the same semiconductor element 401 as in the first embodiment, and an upper interposer 402A as a second printed wiring board (second interposer). Similarly to the first embodiment, the interposers 302A and 402A are each a rectangular multilayer substrate of four layers in plan view. Specifically, the first layer illustrated in FIG. 6A is the surface layer 322 as the second surface layer, the second layer illustrated in FIG. 6B is the inner layer 323 as the first inner layer, the third layer illustrated in FIG. 6C is the inner layer 324 as the second inner layer, and the fourth layer illustrated in FIG. 6D is the surface layer 321 as the first surface layer.

The interposer 302A includes, in addition to the power supply wiring 350 for the semiconductor element 301, multiple power supply wirings for the semiconductor element 401 having the same configuration as that of the power supply wiring 340 according to the first embodiment. In the second embodiment, the interposer 302A includes two power supply wirings $340_1$ and $340_2$.

The power supply wirings $340_1$ and $340_2$ are arranged to extend from the surface layer 321 being the first surface layer to the surface layer 322 being the second surface layer. Then, the power supply wirings $340_1$ and $340_2$ output a power supply voltage being the first power supply voltage input from the surface layer 321 side being the first surface layer side, that is, from the mother board 500A, from the surface layer 322 side being the second surface layer side. In this manner, the power supply wirings $340_1$ and $340_2$ can supply the power supply voltage supplied from the mother board 500A to the power supply terminals 411 of the semiconductor element 401 through the interposer 402A.

Now, specific configurations of the power supply wirings $340_1$ and $340_2$ are described. The power supply wiring $340_1$ includes at least one land 341 ($341_{1-1}$, $341_{2-1}$) as a first power supply input land, which is a part of the conductor lands 331 provided in the surface layer 321 being the first surface layer. The power supply wiring $340_1$ further includes multiple lands 342 ($342_{1-1}$, $342_{2-1}$, $342_{2-1}$) as first power supply output lands, which are a part of the conductor lands 332 provided in the surface layer 322 being the second surface layer. The power supply wiring $340_1$ further includes a power supply pattern $343_1$ as a first power supply pattern, which is provided in the inner layer 323 being the first inner layer.

The lands $341_{1-1}$ and $341_{2-1}$ are electrically connected in parallel to the power supply pattern $343_1$ through the power supply via 344 of the build-up layer 326 (FIG. 1), the power supply via 345 of the core layer 325 (FIG. 1), and the like. The lands $342_{1-1}$, $342_{2-1}$, and $342_{3-1}$ are electrically connected in parallel to the power supply pattern $343_1$ through the power supply via 346 of the build-up layer 327 (FIG. 1) and the like. In other words, the lands $341_{1-1}$ and $341_{2-1}$ and the lands $342_{1-1}$, $342_{2-1}$, and $342_{2-1}$ are electrically connected to each other through the power supply pattern $343_1$ and the like.

Similarly, the power supply wiring $340_2$ includes at least one land 341 ($341_{1-2}$, $341_{2-2}$) as the first power supply input land, which is a part of the conductor lands 331 provided in the surface layer 321 being the first surface layer. The power supply wiring $340_2$ further includes multiple lands 342

($342_{1-2}$, $342_{2-2}$, $342_{2-2}$) as the first power supply output lands, which are a part of the conductor lands 332 provided in the surface layer 322 being the second surface layer. The power supply wiring $340_2$ further includes a power supply pattern $343_2$ as the first power supply pattern, which is provided in the inner layer 323 of the first inner layer.

The lands $341_{1-2}$ and $341_{2-2}$ are electrically connected in parallel to the power supply pattern $343_2$ through the power supply via 344 of the build-up layer 326 (FIG. 1), the power supply via 345 of the core layer 325 (FIG. 1), and the like. The lands $342_{1-2}$, $342_{2-2}$, and $342_{3-2}$ are electrically connected in parallel to the power supply pattern $343_2$ through the power supply via 346 of the build-up layer 327 (FIG. 1) and the like. In other words, the lands $341_{1-2}$ and $341_{2-2}$ and the lands $342_{1-2}$, $342_{2-2}$, and $342_{3-2}$ are electrically connected to each other through the power supply pattern $343_2$ and the like.

In the following, as the occasion demands, the lands $341_{1-1}$, $341_{2-1}$, $341_{1-2}$, and $341_{2-2}$ are referred to as "first power supply lands", the lands $342_{1-1}$, $342_{2-1}$, $342_{1-2}$, and $342_{2-2}$ are referred to as "second power supply lands", and the lands $342_{3-1}$ and $342_{3-2}$ are referred to as "third power supply lands". In the second embodiment, the second power supply land $342_{1-1}$ is provided correspondingly to the first power supply land $341_{1-1}$, and the second power supply land $342_{2-1}$ is provided correspondingly to the first power supply land $341_{2-1}$. Similarly, the second power supply land $342_{1-2}$ is provided correspondingly to the first power supply land $341_{1-2}$, and the second power supply land $342_{2-2}$ is provided correspondingly to the first power supply land $341_{2-2}$. Then, the power supply patterns $343_1$ and $343_2$ are provided in the inner layer 323, and the third power supply lands $342_{3-1}$ and $342_{3-2}$ are provided in the surface layer 322. The first and second power supply lands $341_{1-1}$, $341_{2-1}$, $342_{1-1}$, and $342_{2-1}$ are electrically connected to both end portions of the power supply pattern $343_1$. The first and second power supply lands $341_{1-2}$, $341_{2-2}$, $342_{1-2}$, and $342_{2-2}$ are electrically connected to both end portions of the power supply pattern $343_2$. Then, the third power supply land $342_{3-1}$ is electrically connected to a region between the both end portions of the power supply pattern $343_1$ (for example, at a center portion). The third power supply land $342_{3-2}$ is electrically connected to a region between the both end portions of the power supply pattern $343_2$ (for example, at a center portion).

The lands 341 are joined to conductor lands 541A, which are a part of the conductor lands 531 (FIG. 1) of the mother board 500A, by the solder balls 700 being joint conductors. The lands 342 are joined to conductor lands 441A, which are a part of the conductor lands 431 (FIG. 1) of the interposer 402A, by the solder balls 600 being joint conductors. In this manner, a DC voltage supplied from the conductor lands 541A of the mother board 500A is supplied to the power supply terminals 411 of the semiconductor element 401 through the power supply wirings $340_1$ and $340_2$.

The lands 342 are arranged at the peripheral edges of the surface layer 322 while avoiding the semiconductor element 301. Then, the power supply patterns 343 are arranged at positions that do not overlap the projection region obtained by projecting the semiconductor element 301 onto the inner layer 323. The lands 341 are arranged at positions that do not overlap the projection region obtained by projecting the semiconductor element 301 onto the surface layer 321.

The configuration described above reduces the self-inductance of each of the power supply wirings $340_1$ and $340_2$. Consequently, the quality of power supply to the semiconductor element 401 is improved to stabilize the signal processing operation of the semiconductor element 401.

In the second embodiment, the both end portions of the power supply pattern $343_1$ ($343_2$) are electrically connected to the lands $341_{1-1}$ and $341_{2-1}$ ($341_{1-2}$ and $341_{2-2}$) through the power supply vias 344 and 345. The both end portions of the power supply pattern $343_2$ ($343_2$) are electrically connected to the lands $342_{1-1}$ and $342_{2-1}$ ($342_{1-2}$ and $342_{2-2}$) through the power supply via 346. This configuration prevents a stub in the power supply pattern $343_1$ or $343_2$, and further reduces the self-inductance of the power supply wiring 340. Consequently, the quality of power supply to the semiconductor element 401 is further improved to further stabilize the signal processing operation of the semiconductor element 401.

In the second embodiment, the lands $341_{1-1}$, $341_{2-1}$, $341_{1-2}$, and $341_{2-2}$ are arranged at the four corners of the surface layer 321, and the lands $342_{1-1}$, $342_{2-1}$, $342_{1-2}$, and $342_{2-2}$ are arranged at the four corners of the surface layer 322. Further, the power supply patterns $343_1$ and $343_2$ are arranged at edges of two opposite sides of the inner layer 323. With this configuration, among the multiple solder balls 700, solder balls located at the centers of the sides of the interposer 302A can be used for the signal wiring for transmitting a signal from the semiconductor element 301 to the mother board 500A and for the power supply. In other words, the degree of freedom of wiring in the mother board 500A to the stacked semiconductor device 200A is improved.

Examples 1 & 2

Comparative Example 1

Electromagnetic field analysis was performed for the second embodiment in order to examine the inductance effect. In the analysis, Q3D was used, which is a commercially available quasi-electrostatic field analysis tool using a three-dimensional boundary element method produced by ANSYS, Inc.

Figure 7:
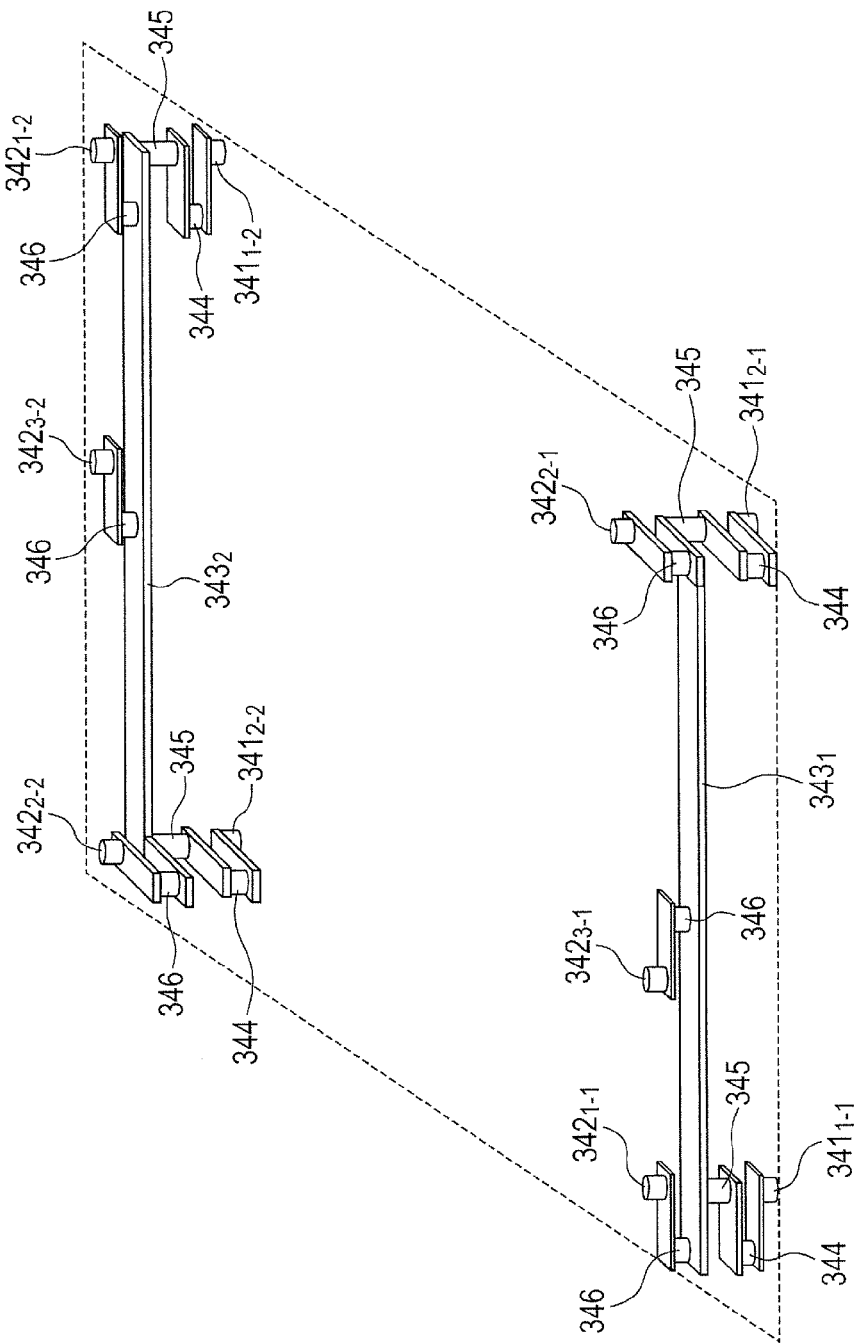
FIG. 7 is a perspective view illustrating power supply wiring according to Example 1 of the present invention.
Figure 8:
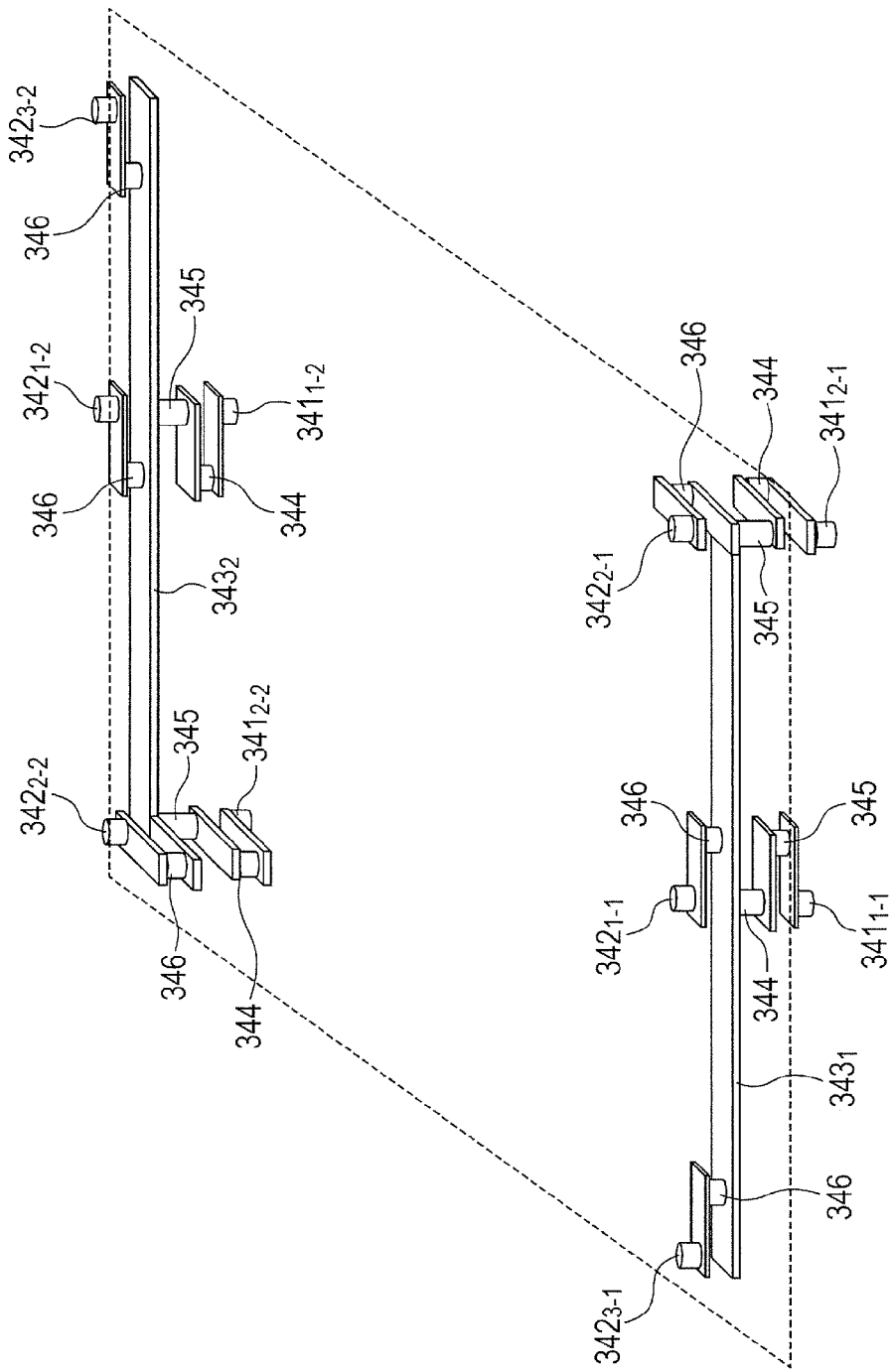
FIG. 8 is a perspective view illustrating power supply wiring according to Example 2 of the present invention.
Figure 9:
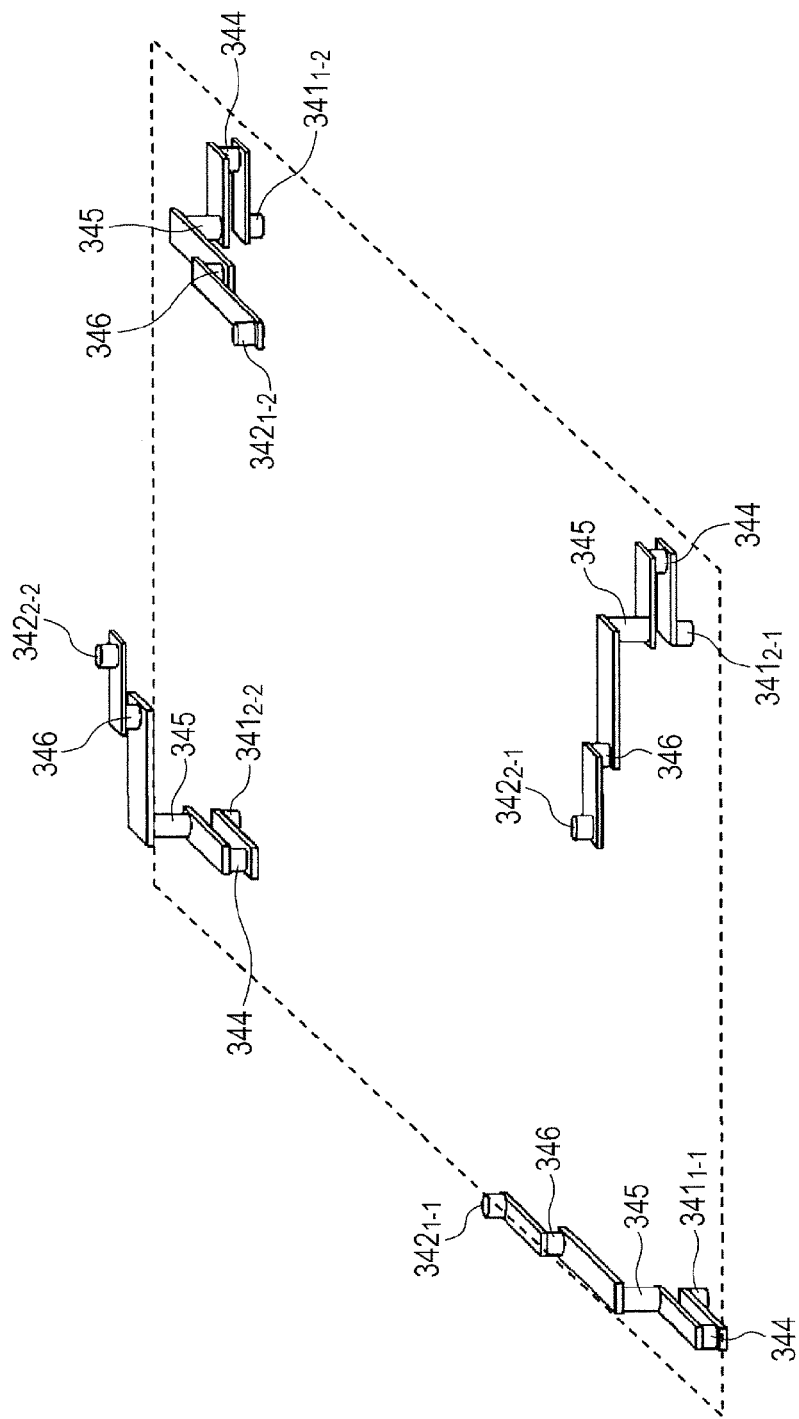
FIG. 9 is a perspective view illustrating power supply wiring according to Comparative Example 1 of the present invention.

FIG. 7 is a perspective view illustrating a power supply wiring according to Example 1. FIG. 8 is a perspective view illustrating a power supply wiring according to Example 2. Example 2 shows the case where the positions of the lands $342_{2-1}$ and $342_{2-2}$ are different from those in Example 1. FIG. 9 is a perspective view illustrating a power supply wiring according to Comparative Example 1.

The power supply wiring of Comparative Example 1 illustrated in FIG. 9 has a configuration in which the number of the lands 341 and the number of the lands 342 are equal to each other and the power supply pattern 343 is not provided. The path from the mother board 500A to the semiconductor package 400A is bent. In FIG. 9, the lands 341 and the lands 342 are each provided at four locations, and the lands 341 and 342 are connected together by means of bending wiring.

Table 1 shows the conditions used for analysis on FIGS. 7 to 9.

TABLE 1

| Analysis model conditions | Example 1 | Example 2 | Comparative Example 1 |
|---|---|---|---|
| Number of first power supply lands | 4 | 4 | 4 |
| Number of second power supply lands | 4 | 4 | 4 |
| Number of third power supply lands | 2 | 2 | None |
| Height of solder ball between packages (μm) | | 120 | |
| Diameter of power supply output land (μm) | | 310 | |

TABLE 1-continued

| Analysis model conditions | Example 1 | Example 2 | Comparative Example 1 |
|---|---|---|---|
| Length of via of build-up layer (μm) | | 80 | |
| Diameter of via of build-up layer (μm) | | 140 | |
| Length of via of core layer (μm) | | 300 | |
| Diameter of via of core layer (μm) | | 300 | |
| Thickness of power supply pattern (μm) | | 20 | |
| Height of solder ball on mother board side (μm) | | 180 | |
| Diameter of power supply input land (μm) | | 350 | |
| Width of power supply pattern (μm) | | 300 | |
| Deviation between first power supply land and third power supply land (mm) | 6 | | — |
| Analytical value | | | |
| Combined inductance value (nH) | 0.131 | 0.133 | 0.139 |

To avoid a complicated model of the diameters of the solder balls 600 and 700, the solder balls 600 and 700 are replaced with a columnar model defined by the diameter of a corresponding land and the height of the solder ball for convenience. In the analysis, the ground was defined at infinity.

Note that, in Example 1, a deviation amount between the first power supply lands $341_{1\text{-}1}$ and $341_{2\text{-}1}$ and the third power supply land $342_{3\text{-}1}$ and a deviation amount between the first power supply lands $341_{1\text{-}2}$ and $341_{2\text{-}2}$ and the third power supply land $342_{3\text{-}2}$ are set to 6 mm. In Example 2, a deviation amount between the first power supply land $341_{1\text{-}1}$ and the third power supply land $342_{3\text{-}1}$ and a deviation amount between the first power supply land $341_{1\text{-}2}$ and the third power supply land $342_{3\text{-}2}$ are set to 6 mm. In Comparative Example 1, a deviation amount between the land 341 and the land 342 is set to 6 mm similarly to the deviation amount between the lands $341_1$ and $341_2$ and the land $342_3$ in Example 1.

The results of inductance are 0.131 nH in Example 1 and 0.133 nH in Example 2 while 0.319 nH in Comparative Example 1, showing that the self-inductance in Examples 1 and 2 was reduced as compared with Comparative Example 1. Example 2 is substantially identical with Example 1, but the self-inductance in Example 2 is slightly higher because the power supply patterns $343_1$ and $343_2$ are stubs. Thus, it was found that the configuration of Example 1 was more desired.

In view of the results above, the increase in self-inductance of the power supply wirings $340_1$ and $340_2$ for supplying power from the mother board 500A to the semiconductor element 401 can be suppressed by the configuration of a low cost substrate without increasing the number of wiring layers. Besides, the number of connections formed of the lands 341 between the stacked semiconductor device 200A and the mother board 500A can be reduced.

Third Embodiment

Figure 10:
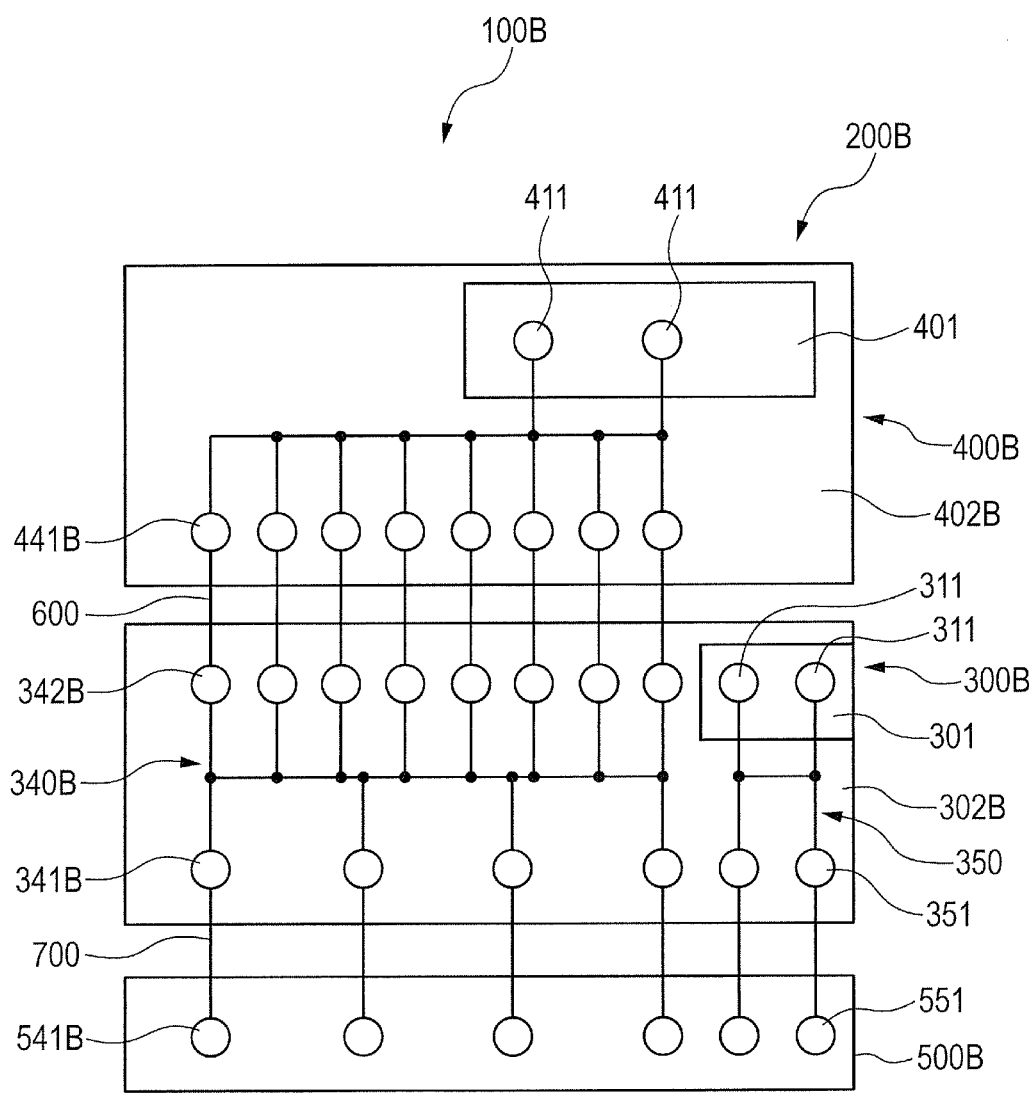
FIG. 10 is a schematic diagram of a printed circuit board according to a third embodiment of the present invention.
Figure 11A:
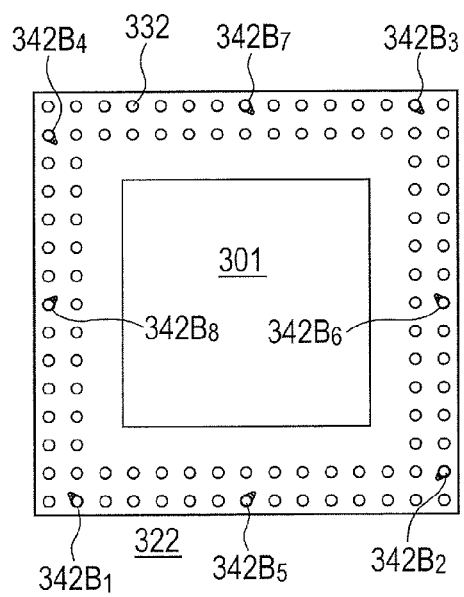
FIGS. 11A, 11B, 11C, and 11D are plan views illustrating respective layers of a first interposer according to the third embodiment.
Figure 11B:
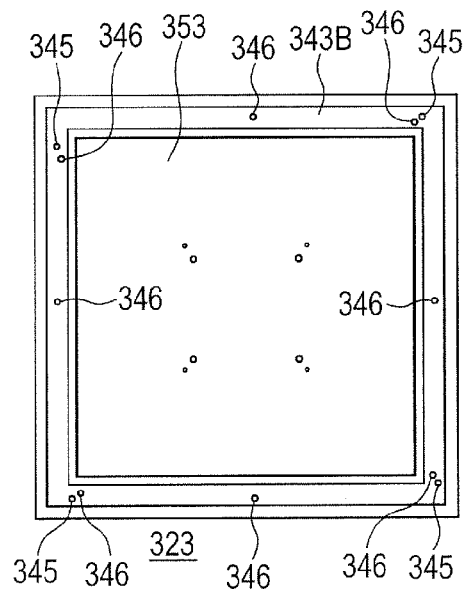
Figure 11C:
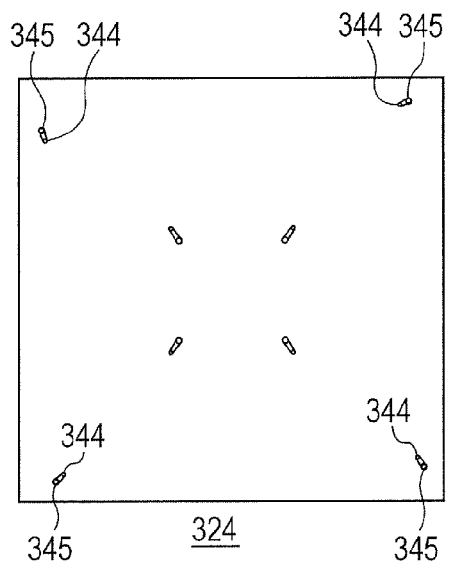
Figure 11D:
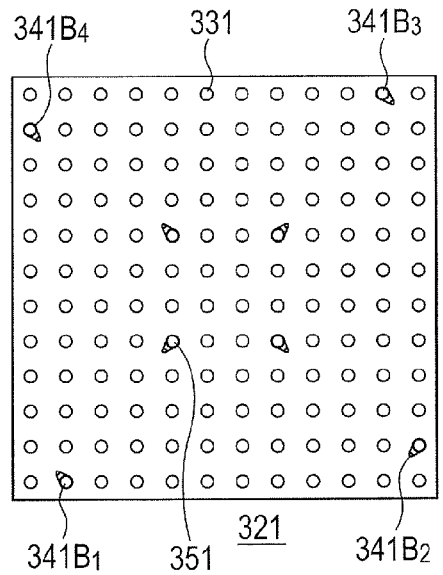

Next, a description is given of a printed circuit board including a stacked semiconductor device according to a third embodiment of the present invention. FIG. 10 is a schematic diagram of the printed circuit board including the stacked semiconductor device according to the third embodiment of the present invention. FIGS. 11A to 11D are plan views illustrating respective layers of a first interposer. FIG. 11A illustrates a first layer, FIG. 11B illustrates a second layer, FIG. 11C illustrates a third layer, and FIG. 11D illustrates a fourth layer. Note that, in the third embodiment, similar components to those in the first embodiment are denoted by the same reference symbols to omit descriptions.

A printed circuit board 100B according to the third embodiment includes a stacked semiconductor device 200B, and a mother board 500B on which the stacked semiconductor device 200B is mounted. The stacked semiconductor device 200B is a stacked semiconductor package having a package-on-package (PoP) structure. The stacked semiconductor device 200B includes a lower semiconductor package 300B as a first semiconductor package and an upper semiconductor package 400B as a second semiconductor package, and the semiconductor package 400B is stacked on the semiconductor package 300B.

The semiconductor package 300B includes the same semiconductor element 301 as in the first embodiment, and a lower interposer 302B as a first printed wiring board (first interposer). The semiconductor package 400B includes the same semiconductor element 401 as in the first embodiment, and an upper interposer 402B as a second printed wiring board (second interposer). Similarly to the first embodiment, the interposers 302B and 402B are each a rectangular multilayer substrate of four layers in plan view. Specifically, the first layer illustrated in FIG. 11A is the surface layer 322 as the second surface layer, the second layer illustrated in FIG. 11B is the inner layer 323 as the first inner layer, the third layer illustrated in FIG. 11C is the inner layer 324 as the second inner layer, and the fourth layer illustrated in FIG. 11D is the surface layer 321 as the first surface layer.

The interposer 302B includes, in addition to the power supply wiring 350 for the semiconductor element 301, a power supply wiring 340B for the semiconductor element 401 having a different configuration from that of the power supply wiring 340 according to the first embodiment.

The power supply wiring 340B is arranged to extend from the surface layer 321 being the first surface layer to the surface layer 322 being the second surface layer. Then, the power supply wiring 340B outputs a power supply voltage being the first power supply voltage input from the surface layer 321 side being the first surface layer side, that is, from the mother board 500B, from the surface layer 322 side being the second surface layer side. In this manner, the power supply wiring 340B can supply the power supply voltage supplied from the mother board 500B to the power supply terminals 411 of the semiconductor element 401 through the interposer 402B.

Now, a specific configuration of the power supply wiring 340B is described. The power supply wiring 340B includes at least one land 341B ($341B_1$, $341B_2$, $341B_3$, $341B_4$) as a first power supply input land, which is a part of the conductor lands 331 provided in the surface layer 321 being the first surface layer. The power supply wiring 340B further includes multiple lands 342B ($342B_1$ to $342B_8$) as first power supply output lands, which are a part of the conductor lands 332 provided in the surface layer 322 being the second surface layer. The power supply wiring 340B further includes a power supply pattern 343B as a first power supply pattern, which is provided in the inner layer 323 being the first inner layer.

In the third embodiment, the number of the lands 342B is larger than the number of the lands 341B. Specifically, the number of the lands 341B is four while the number of the lands 342B is eight, which is larger than the number of the lands 341B.

The lands $341B_1$ to $341B_4$ are electrically connected in parallel to the power supply pattern 343B through the power supply via 344 of the build-up layer 326 (FIG. 1), the power supply via 345 of the core layer 325 (FIG. 1), and the like. The lands $342B_1$ to $342B_8$ are electrically connected in parallel to the power supply pattern 343B through the power supply via 346 of the build-up layer 327 (FIG. 1) and the like. In other words, the lands 341B$_1$ to 341B$_4$ and the lands 342B$_1$ to 342B$_8$ are electrically connected to each other through the power supply pattern 343B and the like.

In the following, as the occasion demands, the lands 341B$_1$ to 341B$_4$ are referred to as "first power supply lands", the lands 342B$_1$ to 342B$_4$ are referred to as "second power supply lands", and the lands 342B$_5$ to 342B$_8$ are referred to as "third power supply lands". In the third embodiment, the second power supply land 342B$_1$ is provided correspondingly to the first power supply land 341B$_1$, and the second power supply land 342B$_2$ is provided correspondingly to the first power supply land 341B$_2$. The second power supply land 342B$_3$ is provided correspondingly to the first power supply land 341B$_3$, and the second power supply land 342B$_4$ is provided correspondingly to the first power supply land 341B$_4$. Then, the power supply pattern 343B is provided in the inner layer 323, and the third power supply lands 342B$_5$ to 342B$_8$ are provided in the surface layer 322. The first power supply lands 341B$_1$ to 341B$_4$ and the second power supply lands 342B$_1$ to 342B$_4$ are electrically connected to the power supply pattern 343B. Further, the third power supply lands 342B$_5$ to 342B$_8$ are electrically connected to the power supply pattern 343B.

The lands 341B are joined to conductor lands 541B, which are a part of the conductor lands 531 (FIG. 1) of the mother board 500B, by the solder balls 700 being joint conductors. The lands 342B are joined to conductor lands 441B, which are a part of the conductor lands 431 (FIG. 1) of the interposer 402B, by the solder balls 600 being joint conductors. In this manner, a DC voltage supplied from the conductor lands 541B of the mother board 500B is supplied to the power supply terminals 411 of the semiconductor element 401 through the power supply wiring 340B.

The lands 342B are arranged at the peripheral edges of the surface layer 322 while avoiding the semiconductor element 301. Then, the power supply pattern 343B is arranged at a position that does not overlap the projection region obtained by projecting the semiconductor element 301 onto the inner layer 323. The lands 341B are arranged at positions that do not overlap the projection region obtained by projecting the semiconductor element 301 onto the surface layer 321.

The configuration described above reduces the self-inductance of the power supply wiring 340B as well. Consequently, the quality of power supply to the semiconductor element 401 is improved to stabilize the signal processing operation of the semiconductor element 401.

In the third embodiment, the first power supply lands 341B$_1$ to 341B$_4$ are arranged at the four corners of the surface layer 321, and the second power supply lands 342B$_1$ to 342B$_4$ are arranged at the four corners of the surface layer 322. Further, the power supply pattern 343B is formed into a shape surrounding the projection region obtained by projecting the semiconductor element 301 onto the inner layer 323, and is, in the third embodiment, arranged at the peripheral edges of the four sides of the inner layer 323. In other words, the power supply pattern 343B is formed into a ring shape. With this configuration, among the multiple solder balls 700, solder balls located at the centers of the sides of the interposer 302B can be used for the signal wiring for transmitting a signal from the semiconductor element 301 to the mother board 500B and for the power supply. In other words, the degree of freedom of wiring in the mother board 500B to the stacked semiconductor device 200B is improved. Besides, the third power supply lands 342B$_5$ to 342B$_8$ can be provided at arbitrary positions, and hence the degree of freedom of wiring to the semiconductor element 401 is improved.

Example 3

Figure 12:
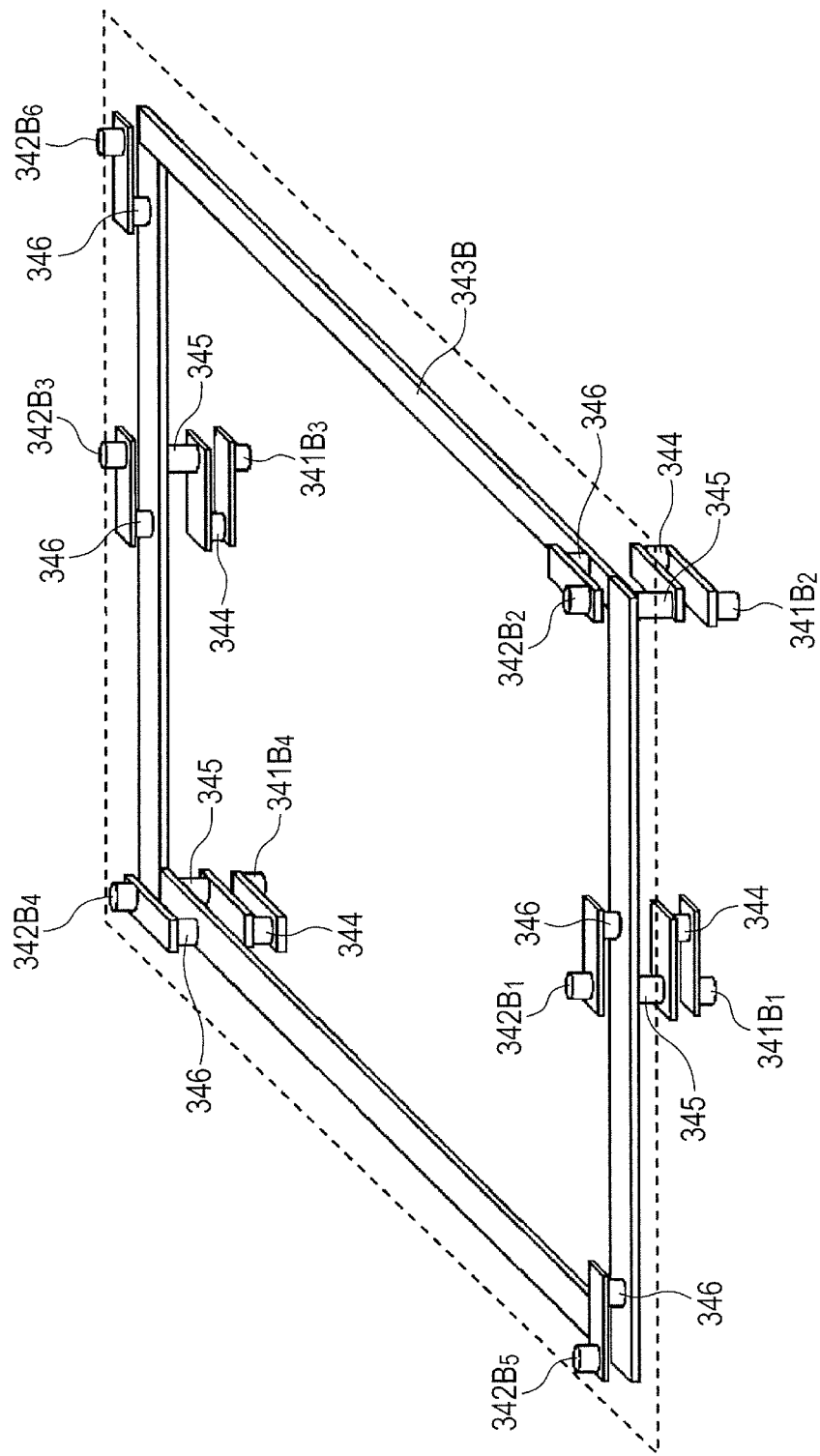
FIG. 12 is a perspective view illustrating power supply wiring according to Example 3 of the present invention.

Electromagnetic field analysis was performed for the third embodiment in order to examine the inductance effect. FIG. 12 is a perspective view illustrating a power supply wiring according to Example 3. FIG. 12 is slightly different from FIGS. 11A to 11D in the structure of the power supply wiring. First, the arrangement positions of the first power supply lands 341B$_1$ and 341B$_3$ are different. The first power supply lands 341B$_1$ and 341B$_3$ are arranged not at the corners but at substantially the centers of the sides. Similarly to the first power supply lands 341B$_1$ and 341B$_3$, the second power supply lands 342B$_1$ and 342B$_3$ are also arranged not at the corners but at substantially the centers of the sides. In addition, the third power supply lands are different in number and arrangement position, and are formed of two third power supply lands 342B$_5$ and 342B$_6$ at the corners.

Table 2 below shows the conditions used for analysis on FIG. 12. Note that, Table 2 also shows the results of Example 1 for comparison.

TABLE 2

| Analysis model conditions | Example 1 | Example 3 |
|---|---|---|
| Number of first power supply lands | 4 | 4 |
| Number of second power supply lands | 4 | 4 |
| Number of third power supply lands | 2 | 2 |
| Height of solder ball between packages (μm) | 120 | |
| Diameter of power supply output land (μm) | 310 | |
| Length of via of build-up layer (μm) | 80 | |
| Diameter of via of build-up layer (μm) | 140 | |
| Length of via of core layer (μm) | 300 | |
| Diameter of via of core layer (μm) | 300 | |
| Thickness of power supply pattern (μm) | 20 | |
| Height of solder ball on mother board side (μm) | 180 | |
| Diameter of power supply input land (μm) | 350 | |
| Width of power supply pattern (μm) | 300 | |
| Arrangement side of power supply pattern | Two sides | Four sides |
| Deviation between first power supply land and third power supply land (mm) | 6 | |
| Analytical value | | |
| Combined inductance value (nH) | 0.131 | 0.129 |

In Example 3, the inductance was 0.129 nH, showing the result equal to or better than 0.131 nH of Example 1.

In view of the results above, the self-inductance in the power supply wiring can be further reduced. Besides, the third power supply lands 342B$_5$ and 342B$_6$ can be arranged at arbitrary positions, and hence the degree of freedom of wiring to the semiconductor element 401 is improved.

Fourth Embodiment

Figure 14A:
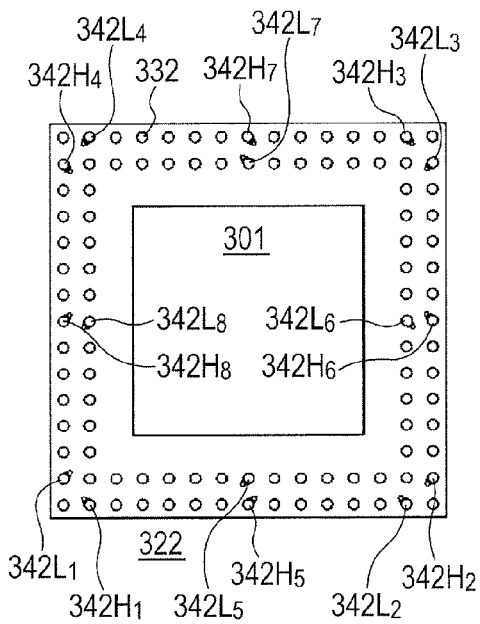
FIGS. 14A, 14B, 14C, and 14D are plan views illustrating respective layers of a first interposer according to the fourth embodiment.
Figure 14B:
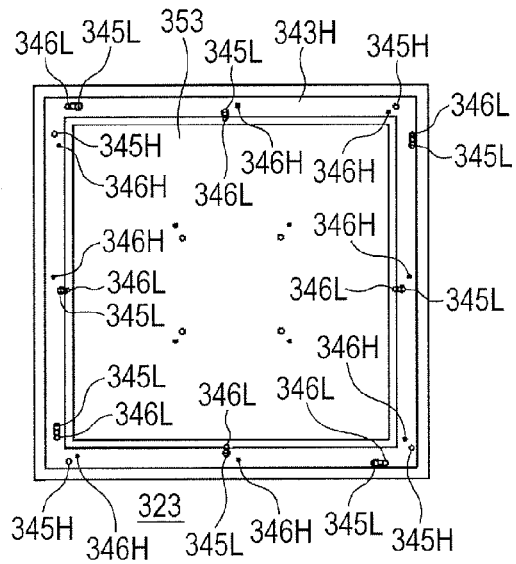
Figure 14C:
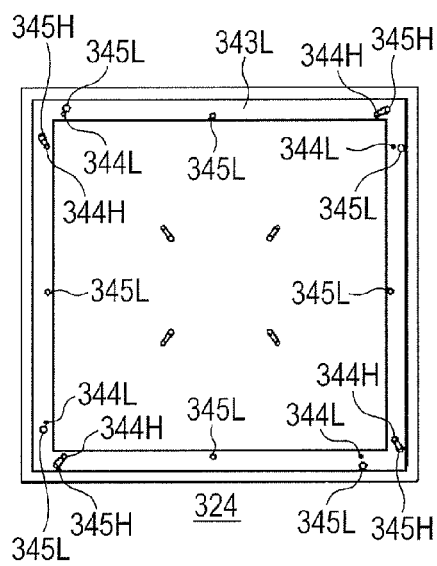
Figure 14D:
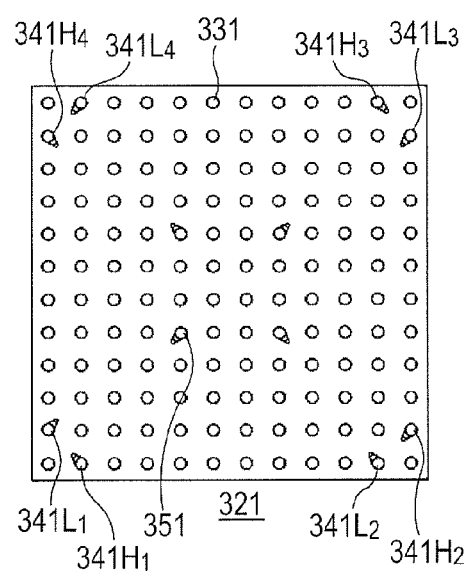

Next, a description is given of a printed circuit board including a stacked semiconductor device according to a fourth embodiment of the present invention. FIG. 13 is a schematic diagram of the printed circuit board including the stacked semiconductor device according to the fourth embodiment of the present invention. FIGS. 14A to 14D are plan views illustrating respective layers of a first interposer. FIG. 14A illustrates a first layer, FIG. 14B illustrates a second layer, FIG. 14C illustrates a third layer, and FIG. 14D illustrates a fourth layer. Note that, in the fourth embodiment, similar components to those in the first embodiment are denoted by the same reference symbols to omit descriptions.

A printed circuit board 100C according to the fourth embodiment includes a stacked semiconductor device 200C, and a mother board 500C on which the stacked semiconductor device 200C is mounted. The stacked semiconductor device 200C is a stacked semiconductor package having a package-on-package (PoP) structure. The stacked semiconductor device 200C includes a lower semiconductor package 300C as a first semiconductor package and an upper semiconductor package 400C as a second semiconductor package, and the semiconductor package 400C is stacked on the semiconductor package 300C.

The semiconductor package 300C includes the same semiconductor element 301 as in the first embodiment, and a lower interposer 302C as a first printed wiring board (first interposer). The semiconductor package 400C includes an upper semiconductor element 401C as a second semiconductor element and an upper interposer 402C as a second printed wiring board (second interposer). Similarly to the first embodiment, the interposers 302C and 402C are each a rectangular multilayer substrate of four layers in plan view. Specifically, the first layer illustrated in FIG. 14A is the surface layer 322 as the second surface layer, the second layer illustrated in FIG. 14B is the inner layer 323 as the first inner layer, the third layer illustrated in FIG. 14C is the inner layer 324 as the second inner layer, and the fourth layer illustrated in FIG. 14D is the surface layer 321 as the first surface layer. The semiconductor element 301 is, for example, a system LSI. The semiconductor element 401C is, for example, a memory.

In the fourth embodiment, the semiconductor element 401C is configured to operate by being supplied with a first power supply voltage as a high voltage and with a second power supply voltage lower than the first power supply voltage. The semiconductor element 401C includes high voltage power supply terminals 411H as first power supply terminals to be supplied with the first power supply voltage, and low voltage power supply terminals 411L as second power supply terminals to be supplied with the second power supply voltage.

The interposer 302C includes, in addition to the power supply wiring 350 for the semiconductor element 301, a high voltage power supply wiring 340H as a first power supply wiring and a low voltage power supply wiring 340L as a second power supply wiring for the semiconductor element 401C.

The power supply wirings 340H and 340L are arranged to extend from the surface layer 321 to the surface layer 322. The power supply wiring 340H outputs the first power supply voltage input from the surface layer 321 side being the first surface layer side, that is, from the mother board 500C, from the surface layer 322 side being the second surface layer side. In this manner, the power supply wiring 340H can supply the first power supply voltage supplied from the mother board 500C to the power supply terminals 411H of the semiconductor element 401C through the interposer 402C.

The power supply wiring 340L outputs the second power supply voltage input from the surface layer 321 side being the first surface layer side, that is, from the mother board 500C, from the surface layer 322 side being the second surface layer side. In this manner, the power supply wiring 340L can supply the second power supply voltage supplied from the mother board 500C to the power supply terminals 411L of the semiconductor element 401C through the interposer 402C.

Now, specific configurations of the power supply wirings 340H and 340L are described. The power supply wiring 340H includes at least one land 341H ($341H_1$ to $341H_4$) as a first power supply input land, which is a part of the conductor lands 331 provided in the surface layer 321 being the first surface layer. The power supply wiring 340H further includes multiple lands 342H ($342H_1$ to $341H_8$) as first power supply output lands, which are a part of the conductor lands 332 provided in the surface layer 322 being the second surface layer. The power supply wiring 340H further includes a power supply pattern 343H as a first power supply pattern, which is provided in the inner layer 323 being the first inner layer. In other words, the power supply pattern 343H is provided in the second layer when the surface layer 322 is regarded as the first layer.

In the fourth embodiment, the number of the lands 342H is larger than the number of the lands 341H. Specifically, the number of the lands 341H is four while the number of the lands 342H is eight, which is larger than the number of the lands 341H.

The lands 341H are electrically connected in parallel to the power supply pattern 343H through a power supply via 344H of the build-up layer 326 (FIG. 1), a power supply via 345H of the core layer 325 (FIG. 1), and the like.

The lands 342H are electrically connected in parallel to the power supply pattern 343H through a power supply via 346H of the build-up layer 327 (FIG. 1) and the like. In other words, the lands 341H and the lands 342H are electrically connected to each other through the power supply pattern 343H and the like.

The power supply wiring 340L includes at least one land 341L ($341L_1$ to $341L_4$) as a second power supply input land, which is a part of the conductor lands 331 provided in the surface layer 321 being the first surface layer. The power supply wiring 340L further includes multiple lands 342L ($342L_1$ to $342L_8$) as second power supply output lands, which are a part of the conductor lands 332 provided in the surface layer 322 being the second surface layer. The power supply wiring 340L further includes a power supply pattern 343L as a second power supply pattern, which is provided in the inner layer 324 being the second inner layer between the first surface layer and the first inner layer. In other words, the power supply pattern 343L is provided in the third layer when the surface layer 322 is regarded as the first layer.

In the fourth embodiment, the number of the lands 342L is larger than the number of the lands 341L. Specifically, the number of the lands 341L is four while the number of the lands 342L is eight, which is larger than the number of the lands 341L.

The lands 341L are electrically connected in parallel to the power supply pattern 343L through a power supply via 344L of the build-up layer 326 (FIG. 1) and the like.

The lands 342L are electrically connected in parallel to the power supply pattern 343L through a power supply via 345L of the core layer 325 (FIG. 1), a power supply via 346L of the build-up layer 327 (FIG. 1), and the like. In other words, the lands 341L and the lands 342L are electrically connected to each other through the power supply pattern 343L and the like.

In the following, as the occasion demands, the lands $341H_1$ to $341H_4$ are referred to as "first high voltage power supply land", the lands $342H_1$ to $342H_4$ are referred to as "second high voltage power supply lands", and the lands $342H_5$ to $342H_8$ are referred to as "third high voltage power supply lands". In the fourth embodiment, the second high voltage power supply land $342H_1$ is provided correspondingly to the first high voltage power supply land $341H_1$, and the second high voltage power supply land $342H_2$ is provided correspondingly to the first high voltage power supply land $341H_2$. The second high voltage power supply land $342H_3$ is provided correspondingly to the first high voltage power supply land $341H_2$, and the second high voltage power supply land $342H_4$ is provided correspondingly to the first high voltage power supply land $341H_4$. Then, the power supply pattern 343H is provided in the inner layer 323, and the third high voltage power supply lands 342H$_5$ to 342H$_8$ are provided in the surface layer 322. The first high voltage power supply lands 341H$_1$ to 341H$_4$ and the second high voltage power supply lands 342H$_1$ to 342H$_4$ are electrically connected to the power supply pattern 343H. In addition, the third high voltage power supply lands 342H$_5$ to 342H$_8$ are electrically connected to the power supply pattern 343H.

Further, as the occasion demands, the lands 341L$_1$ to 341L$_4$ are referred to as "first low voltage power supply lands", the lands 342L$_1$ to 342L$_4$ are referred to as "second low voltage power supply lands", and the lands 342L$_5$ to 342L$_8$ are referred to as "third low voltage power supply lands". In the fourth embodiment, the second low voltage power supply land 342L$_1$ is provided correspondingly to the first low voltage power supply land 341L$_1$, and the second low voltage power supply land 342L$_2$ is provided correspondingly to the first low voltage power supply land 341L$_2$. The second low voltage power supply land 342L$_3$ is provided correspondingly to the first low voltage power supply land 341L$_2$, and the second low voltage power supply land 342L$_4$ is provided correspondingly to the first low voltage power supply land 341L$_4$. Then, the power supply pattern 343L is provided in the inner layer 324, and the third low voltage power supply lands 342L$_5$ to 342L$_8$ are provided in the surface layer 322. The first low voltage power supply lands 341L$_1$ to 341L$_4$ and the second low voltage power supply lands 342L$_1$ to 342L$_4$ are electrically connected to the power supply pattern 343L. In addition, the third low voltage power supply lands 342L$_5$ to 342L$_8$ are electrically connected to the power supply pattern 343L.

The lands 341H and 341L are respectively joined to conductor lands 541H and 541L, which are a part of the conductor lands 531 (FIG. 1) of the mother board 500C, by the solder balls 700 being joint conductors. The lands 342H and 342L are respectively joined to conductor lands 441H and 441L, which are a part of the conductor lands 431 (FIG. 1) of the interposer 402C, by the solder balls 600 being joint conductors. In this manner, DC voltages supplied from the conductor lands 541H and 541L of the mother board 500C are supplied to the power supply terminals 411H and 411L of the semiconductor element 401C through the power supply wirings 340H and 340L, respectively.

The lands 342H and 342L are arranged at the peripheral edges of the surface layer 322 while avoiding the semiconductor element 301. Then, the power supply pattern 343H is arranged at a position that does not overlap the projection region obtained by projecting the semiconductor element 301 onto the inner layer 323. The power supply pattern 343L is arranged at a position that does not overlap a projection region obtained by projecting the semiconductor element 301 onto the inner layer 324. The lands 341H and 341L are arranged at positions that do not overlap the projection region obtained by projecting the semiconductor element 301 onto the surface layer 321.

The configuration described above reduces the self-inductance of each of the power supply wirings 340H and 340L. Consequently, the quality of power supply to the semiconductor element 401C is improved to stabilize the signal processing operation of the semiconductor element 401C.

In the fourth embodiment, the first high voltage power supply lands 341H$_1$ to 341H$_4$ are arranged at the four corners of the surface layer 321, and the second high voltage power supply lands 342H$_1$ to 342H$_4$ are arranged at the four corners of the surface layer 322. Similarly, the first low voltage power supply lands 341L$_1$ to 341L$_4$ are arranged at the four corners of the surface layer 321, and the second low voltage power supply lands 342L$_1$ to 342L$_4$ are arranged at the four corners of the surface layer 322.

Further, the power supply pattern 343H is formed into a shape surrounding the projection region obtained by projecting the semiconductor element 301 onto the inner layer 323, and is, in the fourth embodiment, arranged at the peripheral edges of the four sides of the inner layer 323. In other words, the power supply pattern 343H is formed into a ring shape. Similarly, the power supply pattern 343L is formed into a shape surrounding the projection region obtained by projecting the semiconductor element 301 onto the inner layer 324, and is, in the fourth embodiment, arranged at the peripheral edges of the four sides of the inner layer 324. In other words, the power supply pattern 343L is formed into a ring shape.

With this configuration, among the multiple solder balls 700, solder balls located at the centers of the sides of the interposer 302C can be used for the signal wiring for transmitting a signal from the semiconductor element 301 to the mother board 500C and for the power supply. In other words, the degree of freedom of wiring in the mother board 500C to the stacked semiconductor device 200C is improved. Besides, the third high voltage power supply lands 342H$_5$ to 342H$_8$ and the third low voltage power supply lands 342L$_5$ to 342L$_8$ can be provided at arbitrary positions, and hence the degree of freedom of wiring to the semiconductor element 401C is improved.

In general, the low voltage power supply wiring is lower in noise resistance than the high voltage power supply wiring. In the fourth embodiment, the power supply pattern 343L is closer to the surface layer 321 than the power supply pattern 343H. In this manner, the self-inductance of the power supply wiring 340L is lower than the self-inductance of the power supply wiring 340H, and hence the quality of power supply to the semiconductor element 401C is further improved to further stabilize the signal processing operation of the semiconductor element 401C.

Example 4

Electromagnetic field analysis was performed for the fourth embodiment in order to examine the inductance effect. Table 3 shows the analysis conditions. Note that, in the analysis, the ground was defined at infinity and the model of the solder ball was a cylinder model similarly to the above.

TABLE 3

| Analysis model conditions | High voltage | Low voltage |
| --- | --- | --- |
| Height of solder ball between packages (μm) | 120 | |
| Diameter of power supply output land (μm) | 310 | |
| Length of via of build-up layer (μm) | 80 | |
| Length of via of core layer (μm) | 300 | |
| Diameter of via of build-up layer (μm) | 140 | |
| Diameter of via of core layer (μm) | 300 | |
| Thickness of power supply pattern (μm) | 20 | |
| Width of power supply pattern (μm) | 300 | |
| Wiring layer of power supply pattern | Second layer | Third layer |
| Height of solder ball on mother board side (μm) | 180 | |
| Diameter of power supply input land (μm) | 350 | |
| Deviation between first high voltage power supply land and third high voltage power supply land (mm) | 6 | — |

TABLE 3-continued

| Analysis model conditions | High voltage | Low voltage |
|---|---|---|
| Deviation between first low voltage power supply land and third low voltage power supply land (mm) | — | 6 |
| Analysis result | | |
| Combined inductance value (nH) | 0.129 | 0.121 |

As a result of the analysis, the self-inductance of the high voltage power supply wiring 340H was 0.129 nH, and the self-inductance of the low voltage power supply wiring 340L was 0.121 nH. It was therefore confirmed that the self-inductance was further reduced in the power supply wiring 340L.

Fifth Embodiment

Figure 15:
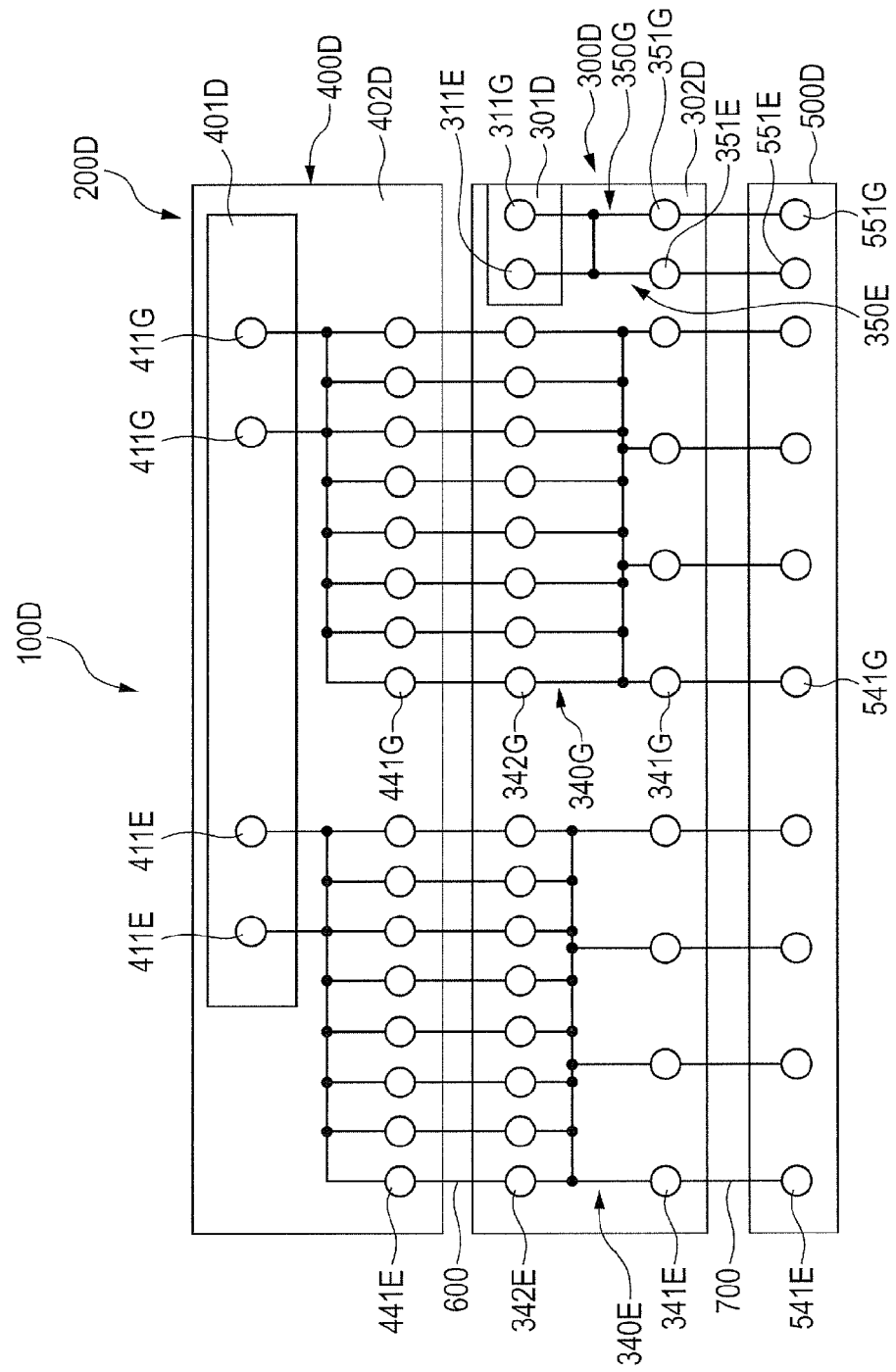
FIG. 15 is a schematic diagram of a printed circuit board according to a fifth embodiment of the present invention.
Figure 16A:
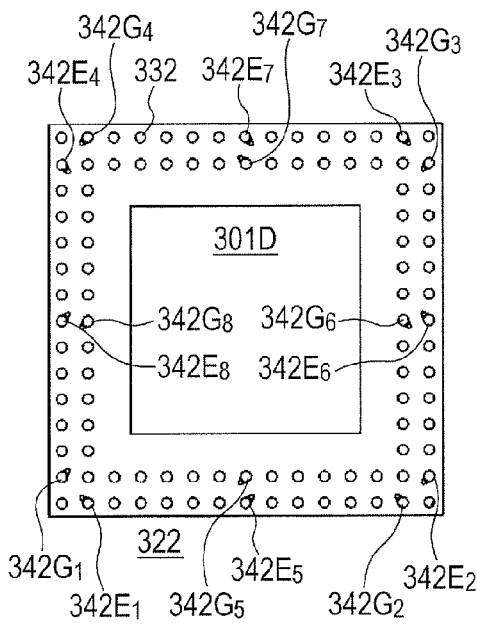
FIGS. 16A, 16B, 16C, and 16D are plan views illustrating respective layers of a first interposer according to the fifth embodiment.
Figure 16B:
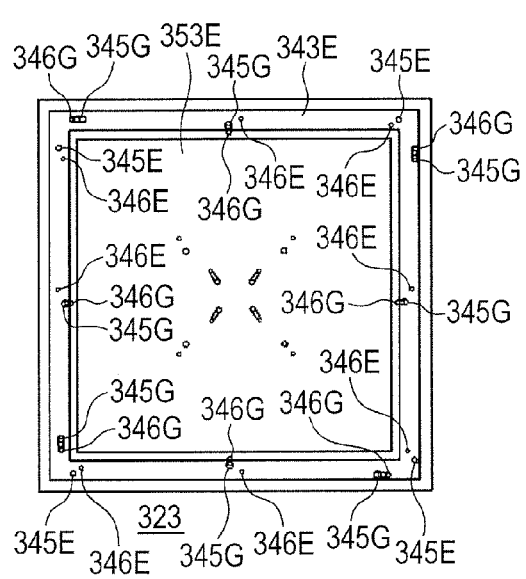
Figure 16C:
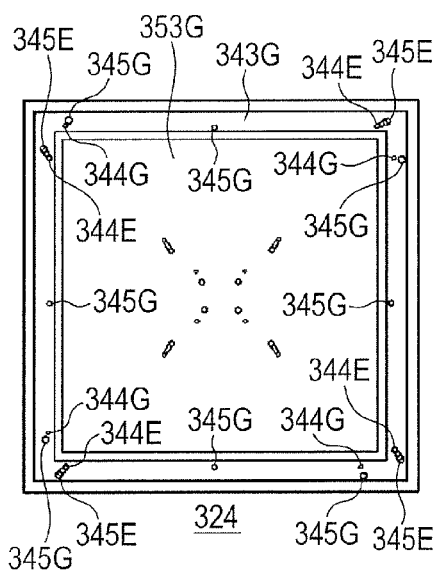
Figure 16D:
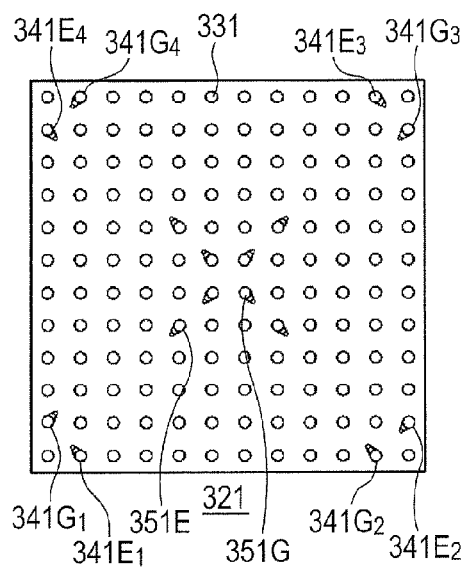

Next, a description is given of a printed circuit board including a stacked semiconductor device according to a fifth embodiment of the present invention. FIG. 15 is a schematic diagram of the printed circuit board including the stacked semiconductor device according to the fifth embodiment of the present invention. FIGS. 16A to 16D are plan views illustrating respective layers of a first interposer. FIG. 16A illustrates a first layer, FIG. 16B illustrates a second layer, FIG. 16C illustrates a third layer, and FIG. 16D illustrates a fourth layer. Note that, in the fifth embodiment, similar components to those in the first embodiment are denoted by the same reference symbols to omit descriptions.

A printed circuit board 100D according to the fifth embodiment includes a stacked semiconductor device 200D, and a mother board 500D on which the stacked semiconductor device 200D is mounted. The stacked semiconductor device 200D is a stacked semiconductor package having a package-on-package (PoP) structure. The stacked semiconductor device 200D includes a lower semiconductor package 300D as a first semiconductor package and an upper semiconductor package 400D as a second semiconductor package, and the semiconductor package 400D is stacked on the semiconductor package 300D.

The semiconductor package 300D includes a lower semiconductor element 301D as a first semiconductor element and a lower interposer 302D as a first printed wiring board (first interposer). The semiconductor package 400D includes an upper semiconductor element 401D as a second semiconductor element and an upper interposer 402D as a second printed wiring board (second interposer). Similarly to the first embodiment, the interposers 302D and 402D are each a rectangular multilayer substrate of four layers in plan view. Specifically, the first layer illustrated in FIG. 16A is the surface layer 322 as the second surface layer, the second layer illustrated in FIG. 16B is the inner layer 323 as the first inner layer, the third layer illustrated in FIG. 16C is the inner layer 324 as the second inner layer, and the fourth layer illustrated in FIG. 16D is the surface layer 321 as the first surface layer. The semiconductor element 301D is, for example, a system LSI. The semiconductor element 401D is, for example, a memory.

In the fifth embodiment, the semiconductor elements 301D and 401D are configured to operate by being supplied with the same power supply voltage (first power supply voltage). The semiconductor element 301D includes a power supply terminal 311E and a ground terminal 311G. The semiconductor element 401D includes power supply terminals 411E as first power supply terminals, and ground terminals 411G.

The interposer 302D includes a power supply wiring 350E for the semiconductor element 301D and a ground wiring 350G for the semiconductor element 301D. The interposer 302D further includes a power supply wiring 340E for the semiconductor element 401D as a first power supply wiring, and a ground wiring 340G for the semiconductor element 401D.

The power supply wirings 340E and 350E and the ground wirings 340G and 350G are arranged to extend from the surface layer 321 to the surface layer 322.

The power supply wiring 340E outputs a power supply voltage being the first power supply voltage input from the surface layer 321 side being the first surface layer side, that is, from the mother board 500D, from the surface layer 322 side being the second surface layer side. In this manner, the power supply wiring 340E can supply the power supply voltage supplied from the mother board 500D to the power supply terminals 411E of the semiconductor element 401D through the interposer 402D.

The power supply wiring 350E can output the power supply voltage being the first power supply voltage input from the surface layer 321 side, that is, from the mother board 500, from the surface layer 322 side, and supply the power supply voltage to the power supply terminal 311E of the semiconductor element 301D.

The ground wiring 340G is electrically connected to the mother board 500D on the surface layer 321 side, and is electrically connected to the ground terminals 411G of the semiconductor element 401D through the interposer 402D on the surface layer 322 side. The ground wiring 350G is electrically connected to the mother board 500D on the surface layer 321 side, and is electrically connected to the ground terminal 311G of the semiconductor element 301D on the surface layer 322 side.

In the fifth embodiment, the power supply wiring 350E is provided independently of the power supply wiring 340E. Consequently, power supply noise generated in the power supply wiring 340E can be prevented from propagating to the power supply wiring 350E, and power supply noise generated in the power supply wiring 350E can be prevented from propagating to the power supply wiring 340E.

In the fifth embodiment, the ground wiring 350G is provided independently of the ground wiring 340G. Consequently, power supply noise generated in the ground wiring 340G can be prevented from propagating to the ground wiring 350G, and power supply noise generated in the ground wiring 350G can be prevented from propagating to the ground wiring 340G.

Now, specific configurations of the power supply wirings 340E and 350E and the ground wirings 340G and 350G are described.

The power supply wiring 340E includes at least one land 341E (341E$_1$ to 341E$_4$) as a first power supply input land, which is a part of the conductor lands 331 provided in the surface layer 321 being the first surface layer. The power supply wiring 340E further includes multiple lands 342E (342E$_1$ to 341E$_8$) as first power supply output lands, which are a part of the conductor lands 332 provided in the surface layer 322 being the second surface layer. The power supply wiring 340E further includes a power supply pattern 343E as a first power supply pattern, which is provided in the inner layer 323. In other words, the power supply pattern 343E is provided in the second layer when the surface layer 322 is regarded as the first layer.

In the fifth embodiment, the number of the lands 342E is larger than the number of the lands 341E. Specifically, the number of the lands 341E is four while the number of the lands 342E is eight, which is larger than the number of the lands 341E.

The lands 341E are electrically connected in parallel to the power supply pattern 343E through a power supply via 344E of the build-up layer 326 (FIG. 1), a power supply via 345E of the core layer 325 (FIG. 1), and the like.

The lands 342E are electrically connected in parallel to the power supply pattern 343E through a power supply via 346E of the build-up layer 327 (FIG. 1) and the like. In other words, the lands 341E and the lands 342E are electrically connected to each other through the power supply pattern 343E and the like.

In the following, as the occasion demands, the lands $341E_1$ to $341E_4$ are referred to as "first power supply lands", the lands $342E_1$ to $342E_4$ are referred to as "second power supply lands", and the lands $342E_5$ to $342E_8$ are referred to as "third power supply lands". In the fifth embodiment, the second power supply land $342E_1$ is provided correspondingly to the first power supply land $341E_1$, and the second power supply land $342E_2$ is provided correspondingly to the first power supply land $341E_2$. The second power supply land $342E_3$ is provided correspondingly to the first power supply land $341E_3$, and the second power supply land $342E_4$ is provided correspondingly to the first power supply land $341E_4$. Then, the power supply pattern 343E is provided in the inner layer 323, and the third power supply lands $342E_5$ to $342E_8$ are provided in the surface layer 322. The first power supply lands $341E_1$ to $341E_4$ and the second power supply lands $342E_1$ to $342E_4$ are electrically connected to the power supply pattern 343E. In addition, the third power supply lands $342E_5$ to $342E_8$ are electrically connected to the power supply pattern 343E.

The lands 342E are arranged at the peripheral edges of the surface layer 322 while avoiding the semiconductor element 301D. Then, the power supply pattern 343E is arranged at a position that does not overlap a projection region obtained by projecting the semiconductor element 301D onto the inner layer 323. The lands 341E are arranged at positions that do not overlap a projection region obtained by projecting the semiconductor element 301D onto the surface layer 321.

On the other hand, the power supply wiring 350E includes a land 351E as a power supply input land, which is a part of the conductor lands 331 provided in the surface layer 321. The power supply wiring 350E further includes a power supply pattern 353E provided in the inner layer 323.

The land 351E is electrically connected to the power supply pattern 353E through a power supply via of the build-up layer, a power supply via of the core layer, and the like. The power supply pattern 353E is electrically connected to the power supply terminal 311E of the semiconductor element 301D through a power supply via of the build-up layer and the like.

In the fifth embodiment, the power supply pattern 353E is formed to be larger than the projection region obtained by projecting the semiconductor element 301D onto the inner layer 323, and is arranged at a position including the projection region. The land 351E is arranged at a position opposed to the semiconductor element 301D, that is, in the projection region obtained by projecting the semiconductor element 301D onto the surface layer 321.

The lands 341E and 351E are respectively joined to conductor lands 541E and 551E, which are a part of the conductor lands 531 (FIG. 1) of the mother board 500D, by the solder balls 700 being joint conductors. The lands 342E are joined to conductor lands 441E, which are a part of the conductor lands 431 (FIG. 1) of the interposer 402D, by the solder balls 600 being joint conductors. In this manner, DC voltages supplied from the conductor lands 541E and 551E of the mother board 500D are supplied to the power supply terminals 411E of the semiconductor element 401D and the power supply terminal 311E of the semiconductor element 301D through the power supply wirings 340E and 350E, respectively.

The ground wiring 340G includes at least one land 341G ($341G_1$ to $341G_4$) as a first ground land, which is a part of the conductor lands 331 provided in the surface layer 321 being the first surface layer. The ground wiring 340G further includes multiple lands 342G ($342G_1$ to $342G_8$) as second ground lands, which are a part of the conductor lands 332 provided in the surface layer 322 being the second surface layer. The ground wiring 340G further includes a ground pattern 343G provided in the inner layer 324, which is an inner layer between the surface layer 321 and the inner layer 323. In other words, the ground pattern 343G is provided in the third layer when the surface layer 322 is regarded as the first layer.

In the fifth embodiment, the number of the lands 342G is larger than the number of the lands 341G. Specifically, the number of the lands 341G is four while the number of the lands 342G is eight, which is larger than the number of the lands 341G.

The lands 341G are electrically connected in parallel to the ground pattern 343G through a ground via 344G of the build-up layer 326 (FIG. 1) and the like.

The lands 342G are electrically connected in parallel to the ground pattern 343G through a ground via 345G of the core layer 325 (FIG. 1), a ground via 346G of the build-up layer 327 (FIG. 1), and the like. In other words, the lands 341G and the lands 342G are electrically connected to each other through the ground pattern 343G and the like.

In the following, as the occasion demands, the lands $341G_1$ to $341G_4$ are referred to as "first GND land", the lands $342G_1$ to $342G_4$ are referred to as "second GND land", and the lands $342G_5$ to $342G_8$ are referred to as "third GND land". In the fifth embodiment, the second GND land $342G_1$ is provided correspondingly to the first GND land $341G_1$, and the second GND land $342G_2$ is provided correspondingly to the first GND land $341G_2$. The second GND land $342G_3$ is provided correspondingly to the first GND land $341G_3$, and the second GND land $342G_4$ is provided correspondingly to the first GND land $341G_4$. Then, the ground pattern 343G is provided in the inner layer 324, and the third GND lands $342G_5$ to $342G_8$ are provided in the surface layer 322. The first GND lands $341G_1$ to $341G_4$ and the second GND lands $342G_1$ to $342G_4$ are electrically connected to the ground pattern 343G. In addition, the third GND lands $342G_5$ to $342G_8$ are electrically connected to the ground pattern 343G.

The lands 342G are arranged at the peripheral edges of the surface layer 322 while avoiding the semiconductor element 301D. Then, the ground pattern 343G is arranged at a position that does not overlap a projection region obtained by projecting the semiconductor element 301D onto the inner layer 324. The lands 341G are arranged at positions that do not overlap the projection region obtained by projecting the semiconductor element 301D onto the surface layer 321.

On the other hand, the ground wiring 350G includes a land 351G as a ground land, which is a part of the conductor lands 331 provided in the surface layer 321. The ground wiring 350G further includes a ground pattern 353G provided in the inner layer 324.

The land 351G is electrically connected to the ground pattern 353G through a power supply via of the build-up layer and the like. The ground pattern 353G is electrically connected to the ground terminal 311G of the semiconductor element 301D through a power supply via of the build-up layer, a power supply via of the core layer, and the like.

In the fifth embodiment, the ground pattern 353G is formed to be larger than the projection region obtained by projecting the semiconductor element 301D onto the inner layer 324, and is arranged at a position including the projection region. The land 351G is arranged at a position opposed to the semiconductor element 301D, that is, in the projection region obtained by projecting the semiconductor element 301D onto the surface layer 321.

The lands 341G and 351G are respectively joined to conductor lands 541G and 551G, which are a part of the conductor lands 531 (FIG. 1) of the mother board 500D, by the solder balls 700 being joint conductors. The lands 342G are joined to conductor lands 441G, which are a part of the conductor lands 431 (FIG. 1) of the interposer 402D, by the solder balls 600 being joint conductors.

The configuration described above reduces the self-inductance of each of the power supply wiring 340E and the ground wiring 340G. Consequently, the quality of power supply to the semiconductor element 401D is improved to stabilize the signal processing operation of the semiconductor element 401D.

In the fifth embodiment, the first power supply lands $341E_1$ to $341E_4$ are arranged at the four corners of the surface layer 321, and the second power supply lands $342E_1$ to $342E_4$ are arranged at the four corners of the surface layer 322. Similarly, the first GND lands $341G_1$ to $341G_4$ are arranged at the four corners of the surface layer 321, and the second GND lands $342G_1$ to $342G_4$ are arranged at the four corners of the surface layer 322.

Further, the power supply pattern 343E is formed into a shape surrounding the projection region obtained by projecting the semiconductor element 301D onto the inner layer 323, and is, in the fifth embodiment, arranged at the peripheral edges of the four sides of the inner layer 323. In other words, the power supply pattern 343E is formed into a ring shape. Similarly, the ground pattern 343G is formed into a shape surrounding the projection region obtained by projecting the semiconductor element 301D onto the inner layer 324, and is, in the fifth embodiment, arranged at the peripheral edges of the four sides of the inner layer 324. In other words, the ground pattern 343G is formed into a ring shape.

With this configuration, among the multiple solder balls 700, solder balls located at the centers of the sides of the interposer 302D can be used for the signal wiring for transmitting a signal from the semiconductor element 301D to the mother board 500D and for the power supply. In other words, the degree of freedom of wiring in the mother board 500D to the stacked semiconductor device 200D is improved. Besides, the third power supply lands $342E_5$ to $342E_8$ and the third GND lands $342G_5$ to $342G_8$ can be provided at arbitrary positions, and hence the degree of freedom of wiring to the semiconductor element 401D is improved.

In the case where multiple power supply wirings 340E having different potentials are provided, the cause of increasing the self-inductance can be suppressed. Besides, the power supply pattern 343E and the ground pattern 343G are arranged in the adjacent layers 323 and 324, respectively, so as to be opposed to each other, and hence the mutual inductance can be increased, with the result that a lower inductance state can be obtained. Consequently, the potential at a high frequency can be stabilized.

Example 5

Electromagnetic field analysis was performed for the fifth embodiment in order to examine the inductance effect. Table 4 shows the analysis conditions. Note that, in the analysis, the model of the solder ball was a cylinder model similarly to the above. Further, as Comparative Example 2, the case without the ground pattern 343G was analyzed.

TABLE 4

| Analysis model conditions | Comparative Example 2 | Example 5 |
|---|---|---|
| Height of solder ball between packages (μm) | 120 | |
| Diameter of power supply output land (μm) | 310 | |
| Diameter of second ground land (μm) | 310 | |
| Length of via of build-up layer (μm) | 80 | |
| Diameter of via of build-up layer (μm) | 140 | |
| Length of via of core layer (μm) | 300 | |
| Diameter of via of core layer (μm) | 300 | |
| Thickness of power supply pattern and ground pattern (μm) | 20 | |
| Width of power supply pattern and ground pattern (μm) | 300 | |
| Wiring layer of power supply pattern | Second layer | Second layer |
| Wiring layer of ground pattern | None | Third layer |
| Height of solder ball on mother board side (μm) | 180 | |
| Diameter of power supply input land (μm) | 350 | |
| Diameter of first ground land (μm) | 350 | |
| Deviation between first power supply land and third power supply land (mm) | 6 | |
| Deviation between first GND land and third GND land (mm) | 6 | |
| Analysis result | | |
| Combined inductance value (nH) | 0.155 | 0.147 |

As a result of the analysis, the self-inductance of the power supply wiring was 0.155 nH in Comparative Example 2 but 0.147 nH in Example 5. It was confirmed that the inductance was reduced due to the mutual inductance effect by bringing the power supply pattern 343E and the ground pattern 343G to be adjacent to each other.

Note that, the present invention is not intended to be limited to the embodiments described above, and various modifications are possible by those having ordinary skill in the art within the technical concept of the present invention.

In the first to fifth embodiments, the case where the multiple power supply input lands are provided is described, but the number of the power supply input lands may be one. In the fifth embodiment, the case where the multiple first ground lands are provided is described, but the number of the first ground lands may be one.

In the first to fifth embodiments, the solder balls are used as the joint conductors between the upper and lower semiconductor packages, but the joint conductors are not limited thereto. As the joint conductor, a structure obtained by forming a solder film on a rigid ball such as a resin ball or a metal ball, or a Cu pillar or an Au pillar may be used.

In the first to fifth embodiments, the case where the first printed wiring board is a multilayer substrate of four layers is described, but the first printed wiring board is not limited to a four-layer substrate. The present invention is applicable to a multilayer substrate of at least three layers.

In the first to fifth embodiments, the power supply pattern is arranged in the first inner layer being the second layer, but the power supply pattern may be arranged in any inner layer. Similarly, the ground pattern may be arranged in any inner layer.

In the first to fifth embodiments, the first semiconductor element and the second semiconductor element are configured to operate with the same power supply voltage, but the present invention is applicable also to the case where the first semiconductor element and the second semiconductor element are configured to operate with difference power supply voltages.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-198021, filed Sep. 10, 2012, which is hereby incorporated by reference herein in its entirety.

What is claimed is:

1. A stacked semiconductor device comprising:
a first semiconductor package; and
a second semiconductor package stacked on the first semiconductor package through a solder joint portion,
the first semiconductor package comprising:
 a first semiconductor element; and
 a first printed wiring board on which the first semiconductor element is mounted,
 the first printed wiring board comprising:
  a first power supply input land provided in a first surface layer of the first printed wiring board, for establishing connection to an outside of the stacked semiconductor device;
  a first power supply output land provided in a second surface layer of the first printed wiring board on the second semiconductor package side, for establishing connection to the second semiconductor package, the second surface layer being located on a rear side of the first surface layer; and
  a first power supply pattern provided in a first inner layer between the first surface layer and the second surface layer and electrically connected to the first power supply input land and the first power supply output land,
the second semiconductor package comprising:
 a second semiconductor element; and
 a second printed wiring board on which the second semiconductor element is mounted,
 the second printed wiring board comprising a second power supply input land provided in a third surface layer of the second printed wiring board on the first semiconductor package side, for establishing connection to the first power supply output land through the solder joint portion,
 the second power supply input land being connected to a first power supply terminal of the second semiconductor element,
wherein a number of the first power supply output lands connected to the first power supply pattern is larger than a number of the first power supply input lands connected to the first power supply pattern.

2. The stacked semiconductor device according to claim 1, wherein at least both end portions of the first power supply pattern are electrically connected to the first power supply output lands.

3. The stacked semiconductor device according to claim 1, wherein the first power supply pattern is formed at an outer periphery portion of the first printed wiring board.

4. The stacked semiconductor device according to claim 3, wherein the first power supply input lands connected to the first power supply pattern are formed at four corners of the first printed wiring board.

5. The stacked semiconductor device according to claim 3, wherein the first printed wiring board comprises a plurality of the first power supply pattern.

6. The printed circuit board, comprising:
a mother board; and
the stacked semiconductor device according to claim 1 mounted on the mother board,
wherein the first power supply input land is connected to a first power supply land of the mother board by solder.

7. The stacked semiconductor device according to claim 1, wherein:
the first printed wiring board further comprises:
 a third power supply input land provided in the first surface layer of the first printed wiring board, for establishing connection to the outside of the stacked semiconductor device;
 a second power supply output land provided in the second surface layer of the first printed wiring board on the second semiconductor package side, for establishing connection to the second semiconductor package, the second surface layer being located on the rear side of the first surface layer; and
 a second power supply pattern provided in the first inner layer between the first surface layer and the second surface layer and electrically connected to the third power supply input land and the second power supply output land;
the second printed wiring board further comprises a fourth power supply input land provided in the third surface layer of the second printed wiring board on the first semiconductor package side, for establishing connection to the second power supply output land through the solder joint portion; and
the fourth power supply input land is connected to a second power supply terminal of the second semiconductor element.

8. The stacked semiconductor device according to claim 7, wherein at least both end portions of the second power supply pattern are electrically connected to the second power supply output lands.

9. The stacked semiconductor device according to claim 7, wherein the second power supply pattern is formed at an outer periphery portion of the first printed wiring board.

10. The stacked semiconductor device according to claim 9, wherein the second power supply input lands connected to the second power supply pattern are formed at four corners of the first printed wiring board.

11. The stacked semiconductor device according to claim 9, wherein the first printed wiring board comprises a plurality of second power supply wirings.

12. A printed circuit board comprising:
a mother board; and
the stacked semiconductor device according to claim 7 mounted on the mother board,
wherein the first power supply input land is connected to a first power supply land of the mother board by solder, and the third power supply input land is connected to a second power supply land of the mother board by solder.

13. The stacked semiconductor device according to claim 1, wherein:
the first printed wiring board further comprises:
 a fifth power supply input land provided in the first surface layer of the first printed wiring board, for establishing connection to the outside of the stacked semiconductor device;
 a third power supply output land provided in the second surface layer of the first printed wiring board on the second semiconductor package side, for establishing connection to the second semiconductor package, the second surface layer being located on the rear side of the first surface layer; and a third power supply pattern provided in a second inner layer between the first surface layer and the second surface layer different from the first inner layer and electrically connected to the fifth power supply input land and the third power supply output land;

the second printed wiring board further comprises a sixth power supply input land provided in the third surface layer of the second printed wiring board on the first semiconductor package side, for establishing connection to the third power supply output land through the solder joint portion;

the sixth power supply input land is connected to a third power supply terminal that inputs a voltage different from a voltage of the first power supply terminal of the second semiconductor element; and a number of the fifth power supply output lands connected to the third power supply pattern is larger than a number of the third power supply input lands connected to the third power supply pattern.

14. The stacked semiconductor device according to claim 13, wherein at least both end portions of the first power supply pattern are electrically connected to the first power supply output lands, and at least both end portions of the third power supply pattern are electrically connected to the third power supply output lands.

15. The stacked semiconductor device according to claim 14, wherein the first power supply pattern and the third power supply pattern are formed at an outer periphery portion of the first printed wiring board.

16. The stacked semiconductor device according to claim 14, wherein the first power supply input lands connected to the first power supply pattern and the fifth power supply input lands connected to the third power supply pattern are formed at four corners of the first printed wiring board.

17. A printed circuit board comprising:
a mother board; and
the stacked semiconductor device according to claim 13 mounted on the mother board, wherein the first power supply input land is connected to a first power supply land of the mother stacked by solder, and the third power supply input land is connected to a third power supply land of the mother board by solder.

18. The stacked semiconductor device according to claim 1, wherein:
the first printed wiring board further comprises:
a first ground input land provided in the first surface layer of the first printed wiring board, for establishing connection to the outside of the stacked semiconductor device;
a first ground output land provided in the second surface layer of the first printed wiring board on the second semiconductor package side, for establishing connection to the second semiconductor package, the second surface layer being located on the rear side of the first surface layer; and
a first ground pattern provided in a second inner layer between the first surface layer and the second surface layer different from the first inner layer and electrically connected to the first ground input land and the first ground output land;

the second printed wiring board further comprises a second ground input land provided in the third surface layer of the second printed wiring board on the first semiconductor package side, for establishing connection to the first ground output land through the solder joint portion;

the second ground input land is connected to a first ground terminal of the second semiconductor chip; and a number of the first ground output lands connected to the first ground pattern is larger than a number of the first ground input lands connected to the first ground pattern.

19. A printed circuit board, comprising:
a mother board; and
the stacked semiconductor device according to claim 18 mounted on the mother board,
wherein the first power supply input land is connected to a first power supply land of the mother board by solder, and the first ground input land is connected to a first ground land of the mother board by solder.

* * * * *